United States Patent
Priya et al.

(10) Patent No.: US 11,424,421 B2
(45) Date of Patent: Aug. 23, 2022

(54) BIO-MOLECULAR ENGINEERING STRATEGY FOR EFFICIENT PEROVSKITE MATERIALS AND DEVICES

(71) Applicant: The Penn State Research Foundation, University Park, PA (US)

(72) Inventors: Shashank Priya, State College, PA (US); Yuchen Hou, Shandong (CN); Kai Wang, Zhejiang (CN)

(73) Assignee: THE PENN STATE RESEARCH FOUNDATION, University Park, PA (US)

( * ) Notice: Subject to any disclaimer, the term of this patent is extended or adjusted under 35 U.S.C. 154(b) by 0 days.

(21) Appl. No.: 17/594,591

(22) PCT Filed: May 1, 2020

(86) PCT No.: PCT/US2020/030986
§ 371 (c)(1),
(2) Date: Oct. 22, 2021

(87) PCT Pub. No.: WO2020/223617
PCT Pub. Date: Nov. 5, 2020

(65) Prior Publication Data
US 2022/0149301 A1 May 12, 2022

Related U.S. Application Data

(60) Provisional application No. 62/842,095, filed on May 2, 2019.

(51) Int. Cl.
*H01L 51/00* (2006.01)
*H01L 51/50* (2006.01)

(52) U.S. Cl.
CPC ...... *H01L 51/0093* (2013.01); *H01L 51/5004* (2013.01); *H01L 51/5056* (2013.01); *H01L 51/5072* (2013.01); *H01L 2251/301* (2013.01); *H01L 2251/552* (2013.01)

(58) Field of Classification Search
CPC .......... H01L 51/0093; H01L 51/5004
See application file for complete search history.

(56) References Cited

FOREIGN PATENT DOCUMENTS

| | | |
|---|---|---|
| JP | 2005-44576 A | 2/2005 |
| WO | 2010135319 A1 | 11/2010 |

OTHER PUBLICATIONS

International Search Report and Written Opinion for Application No. PCT/US 2020/030986 filed May 1,2020 dated Jul. 30, 2020.
(Continued)

*Primary Examiner* — Anthony Ho
(74) *Attorney, Agent, or Firm* — Buchanan Ingersoll & Rooney PC

(57) ABSTRACT

Embodiments relate to a light-harvesting perovskite layer including having deoxyribonucleic acid (DNA) molecules incorporated within the perovskite crystal to serve as an effective carrier transport medium. Some embodiments include formation of a DNA doped MAPbI$_3$, the DNA doped MAPbI$_3$ being formed by using a DNA-hexadecyl trimethyl ammonium chloride ("DNA-CTMA") complex. The DNA doped MAPbI$_3$ can be used as the light-harvesting perovskite layer in a photovoltaic device. Other molecules such as artemisinin (ART) and melanin are also demonstrated to show the effectiveness in charge and thermal transport.

22 Claims, 28 Drawing Sheets

(56) References Cited

OTHER PUBLICATIONS

Bin Mohd Yusoff, A.R., et al., New Horizons for Perovskite Solar Cells Employing DNA-CTMA as the Hole-Transporting Material, 2016, ChemSusChem, 9, 1736-1742, Wiley-VCH Verlag GmbH & Co.. KGaA, Weinheim.

BIO-MOLECULAR ENGINEERING STRATEGY FOR EFFICIENT PEROVSKITE MATERIALS AND DEVICES

CROSS-REFERENCE TO RELATED APPLICATIONS

This application is a U.S. national state application under 35 USC § 371 for International Patent Application No. PCT/US2020/030986, filed on May 1, 2020, which is related to and claims the benefit of U.S. provisional application No. 62/842,095, filed on May 2, 2019, the entire contents of which is incorporated by reference in its entirety.

STATEMENT REGARDING FEDERALLY SPONSORED RESEARCH OR DEVELOPMENT

This invention was made with government support under Grant No. FA9550-18-1-0233 awarded by the United States Air Force. The Government has certain rights in the invention.

FIELD OF THE INVENTION

Embodiments relate to a light-harvesting perovskite layer having deoxyribonucleic acid (DNA) molecules incorporated within the perovskite crystal to serve as an effective carrier transport medium. Biomolecules, Artemisinin (ART) and Melanin, are also demonstrated to show improved charge transport and light to thermal conversion.

BACKGROUND OF THE INVENTION

A perovskite solar cell (PSC) is a light-to-electricity conversion optoelectronic device. It typically exhibits a high conversion efficiency and facile fabrication processes, as compared to other solar cell designs. Conventional PSC systems have a transparent electrode (could be Indium tin oxide (ITO), Fluorine-doped tin oxide (FTO) or other transparent conducting oxide (TCO)), a light-harvesting perovskite layer (PVK, having a general formula of $ABX_3$ with A being amine such as methylaminium (MA), formamidinium (FA) or cesium (Cs), B being lead (Pb) or tin (Sn) or other bivalent metals, and X being halogen such as chlorine (Cl), bromine (Br), Iodine (I)), an electron transport layer (ETL), usually an n-type semiconductor such as Zinc oxide (ZnO), titanium oxide ($TiO_2$), tin oxide ($SnO_2$), cerium oxide ($CeO_2$), phenyl-C61-butyric acid methyl ester ("PCBM") PCBM or other fullerene derivatives, etc., a hole transport layer (HTL), usually a p-type semiconductor such as nickel oxide (NiO), Molybdenum oxide ($MoO_x$), poly(3,4-ethylenedioxythiophene) polystyrene sulfonate (PEDOT:PSS), Poly[bis(4-phenyl)(2,5,6-trimethylphenyl)amine ("PTAA"), Poly(3-hexylthiophene) ("P3HT"), etc.) and an electrode (could be gold, silver, aluminum, conductive carbon materials, or conductive oxides (indium tin oxide, metal-doped zinc oxide, reduced graphene oxide, etc.) as components of the PSC. Conventional methods for optimizing these components are limited to introducing an organic into the PVK crystals and the typical organic dopant are randomly dispersed among perovskite crystalline grains, resulting in an incoherent perovskite/molecule interface. This inhomogeneous structure tends to cause inferior photovoltaic performance and is problematic in fabrication of the solar cells using the roll-to-roll and slot-die based manufacturing processes.

Conventional Perovskite solar cell systems can be appreciated from CN103746078, CN104393109, and New Horizons for Perovskite Solar Cells Employing DNA-CTMA as the Hole-Transporting Material, by Rashid bin Mohd Yusoff, et. al, May 11, 2016, avail at https://doi.org/10.1002/csse.201600288).

BRIEF SUMMARY OF THE INVENTION

Embodiments of the system relate to a PSC system having deoxyribonucleic acid (DNA) molecules. The DNA can be commercialized DNA (e.g., from salmon testes, herring sperm and calf thymus) or any lab-synthesized DNA using artificial sequencing with tunable length, twist, strand (single or double), and order of nucleotides to achieve band matching. The DNA could also be modified by surfactant such as Cetyltrimethylammonium chloride (CTMA) or any other surfactant molecules such as cetyltrimethylammonium bromide (C16, CTAB), dodecyltrimethylammonium bromide (C12, DTAB), etc.) incorporated within the perovskite photo-active layer (the PVK layer, having a general formula of $ABX_3$ with A being amine such as MA, FA or Cs, B being Pb or Sn or other bivalent metals, and X being halogen such as Cl, Br, I). The DNA can be commercialized DNA (e.g., from salmon testes, herring sperm and calf thymus) or any lab-synthesized DNA using artificial sequencing with tunable length, twist, strand (single or double), and order of nucleotides to achieve band matching. The DNA could also be modified by surfactant such as Cetyltrimethylammonium chloride (CTMA) or any other surfactant molecules such as cetyltrimethylammonium bromide (C16, CTAB), dodecyltrimethylammonium bromide (C12, DTAB), etc.) molecules form a core-shell structure with PVK ($ABX_3$ with A being amine such as MA. FA or Cs. B being Pb or Sn or other bivalent metals, and X being halogen such as Cl, Br, I) crystals through a self-assembly process, which results in a coherent coupling between perovskite and DNA. This PSC system, being a hybrid DNA-PVK structure consists of any form of DNA and perovskite, where DNA can be commercialized DNA (e.g., from salmon testes, herring sperm and calf thymus) or any lab-synthesized DNA using artificial sequencing with tunable length, twist, strand (single or double), and order of nucleotides to achieve band matching, with or without surfactant modification by surfactant molecules such as Cetyltrimethylammonium chloride (CTMA), cetyltrimethylammonium bromide (C16, CTAB), dodecyltrimethylammonium bromide (C12, DTAB), etc., and PVK could be ABX, with A being amine such as MA, FA or Cs, B being Pb or Sn or other bivalent metals, and X being halogen such as Cl, Br, I), can effectively increase the conversion efficiency of the solar cell from 18% to 20%, as compared with a pristine PVK-based device. In addition, such a PSC system can enable the fabrication of PSC devices without an HTL, while the PSC device exhibits a conversion efficiency of 14% or higher for the HTL-free device, where HTL could be a p-type semiconductor such as NiO, $MoO_x$, poly(3,4-ethylenedioxythiophene) polystyrene sulfonate (PEDOT:PSS), Poly[bis(4-phenyl)(2,5,6-trimethylphenyl) amine (PTAA), Poly(3-hexylthiophene) ("P3HT"), etc.). In contrast to conventional PSC systems (e.g., artificial polymer molecules), DNA is an abundant natural bio-molecule and can be used as a component in solid-state molecular devices due to its locally coherent charge transport and unique molecular recognition and self-assembly capability. In addition, DNA can be programmed by changing nucleobase sequencing, thus properties of devices made from such DNA components can be modified as needed.

In an exemplary embodiment, a photoactive material can include a perovskite crystal structure having deoxyribonucleic acid-hexadecyl trimethyl ammonium chloride (DNA-CTMA), where CTMA is Cetyltrimethylammonium chloride and could be any other surfactant molecules such as cetyltrimethylammonium bromide (C16, CTAB), dodecyltrimethylammonium bromide (C12, DTAB), etc.

In some embodiments, the perovskite crystal structure includes $MAPbI_3$ and any other forms of $ABX_3$ with A being amine such as MA, FA or Cs, B being Pb or Sn or other bivalent metals, and X being halogen such as Cl, Br, I.

In some embodiments, the DNA-CTMA is formed at a grain boundary of the perovskite crystal structure. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc. The perovskite is $ABX_3$ with A being amine such as MA, FA or Cs, B being Pb or Sn or other bivalent metals, and X being halogen such as Cl, Br, I).

In some embodiments, the DNA-CTMA is formed at more than one grain boundary of the perovskite crystal structure. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc. The perovskite is $ABX_3$ with A being amine such as MA, FA or Cs, B being Pb or Sn or other bivalent metals, and X being halogen such as Cl, Br, I.

In some embodiments, the DNA-CTMA is wrapped around the perovskite crystal structure at the grain boundary. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc. The perovskite is $ABX_3$ with A being amine such as MA, FA or Cs, B being Pb or Sn or other bivalent metals, and X being halogen such as Cl, Br, I.

In some embodiments, the DNA-CTMA is wrapped around the perovskite crystal structure at more than one grain boundary. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc. The perovskite (PVK) is $ABX_3$ with A being amine such as MA, FA or Cs, B being Pb or Sn or other bivalent metals, and X being halogen such as Cl, Br, I.

In some embodiments, the DNA within DNA-CTMA facilitates hole transport by holes hopping among delocalized highest occupied molecular orbital (HOMO) orbits of DNA bases. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc.

In an exemplary embodiment, a perovskite solar cell consisting essentially of: a substrate; an electron transport layer (ETL) disposed on at least a portion of a surface of the substrate; a light-harvesting perovskite layer (PVK) disposed on at least a portion of a surface of the ETL, the PVK comprising a perovskite crystal structure having deoxyribonucleic acid-hexadecyl trimethyl ammonium chloride (DNA-CTMA); and an electrode disposed on at least a portion of the PVK. Here the substrate could be Indium tin oxide (ITO), Fluorine-doped tin oxide (FTO) or other transparent conducting oxide (TCO). The electrode could be gold, silver, aluminum, conductive carbon materials, or conductive oxides (indium tin oxide, metal-doped zinc oxide, reduced graphene oxide, etc. The ETL is usually an n-type semiconductor such as ZnO, $TiO_2$, $SnO_2$, $CeO_2$, PCBM or other fullerene derivatives, etc. The perovskite (PVK) is $ABX_3$ with A being amine such as MA, FA or Cs, B being Pb or Sn or other bivalent metals, and X being halogen such as Cl, Br, I. The DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc.

In some embodiments, the DNA within DNA-CTMA facilitates hole transport by holes hopping among delocalized highest occupied molecular orbital (HOMO) orbits of DNA bases. Here the DNA could be commercialized DNA (e.g., from salmon testes, herring sperm and calf thymus) or any lab-synthesized DNA using artificial gene synthesis with tunable length, twist, strand (single or double), and order of nucleotides to achieve band matching.

In an exemplary embodiment, a perovskite solar cell can include a substrate. The perovskite solar cell can include an electron transport layer (ETL) disposed on at least a portion of a surface of the substrate. The perovskite solar cell can include a light-harvesting perovskite layer (PVK) disposed on at least a portion of a surface of the ETL, the PVK comprising of a perovskite crystal structure and includes deoxyribonucleic acid-hexadecyl trimethyl ammonium chloride (DNA-CTMA). The perovskite solar cell can include a hole transport layer (HTL) disposed on at least a portion of a surface of the PVK. The perovskite solar cell can include an electrode disposed on at least a portion of a surface of the HTL. Here the substrate could be Indium tin oxide (ITO), Fluorine-doped tin oxide (FTO) or other transparent conducting oxide (TCO). The electrode could be gold, silver, aluminum, conductive carbon materials, or conductive oxides (indium tin oxide, metal-doped zinc oxide, reduced graphene oxide, etc). The ETL is usually an n-type semiconductor such as ZnO, $TiO_2$, $SnO_2$, $CeO_2$, PCBM or other fullerene derivatives, etc. The HTL could be a p-type semiconductor such as NiO, $MoO_x$, poly(3,4-ethylenedioxythiophene) polystyrene sulfonate (PEDOT: PSS), Poly[bis(4-phenyl)(2,5,6-trimethylphenyl)amine (PTAA), Poly(3-hexylthiophene) ("P3HT"), etc. The perovskite (PVK) is $ABX_3$ with A being amine such as MA, FA or Cs, B being Pb or Sn or other bivalent metals, and X being halogen such as Cl, Br, I. The DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc.

The perovskite solar cell can include an electrical circuit to facilitate capture of electric energy output generated by the perovskite solar cell. The perovskite (PVK) is $ABX_3$ with A being amine such as MA, FA or Cs, B being Pb or Sn or other bivalent metals, and X being halogen such as Cl, Br, I.

In some embodiments, the DNA within DNA-CTMA facilitates hole transport by holes hopping among delocalized highest occupied molecular orbital (HOMO) orbits of DNA bases. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc.

In some embodiments, the DNA includes DNA from salmon testes. It could also be other commercial DNA (e.g., from herring sperm and calf thymus) or any lab-synthesized DNA using artificial sequencing with tunable length, twist, strand (single or double), and order of nucleotides to achieve band matching.

In some embodiments, the perovskite crystal structure includes $MAPbI_3$. It could also be other perovskite structured materials with a formula of ABX, with A being amine such as MA, FA or Cs, B being Pb or Sn or other bivalent metals, and X being halogen such as Cl, Br, I.

In some embodiments, the substrate includes fluorine doped tin oxide (FTO). It could also be indium tin oxide (ITO), or other transparent conducting oxide (TCO).

In some embodiments, the ETL includes titanium oxide. It could also be other n-type semiconductor such as ZnO, $TiO_2$, $SnO_2$, $CeO_2$, PCBM or other fullerene derivatives, etc.

In some embodiments, the HTL includes 2,2',7,7'-Tetrakis [N,N-di(4-methoxyphenyl)amino]-9,9'-spirobifluorene. It could also be p-type semiconductor such as NiO, $MoO_x$, poly(3,4-ethylenedioxythiophene) polystyrene sulfonate (PEDOT:PSS), Poly[bis(4-phenyl)(2,5,6-trimethylphenyl) amine (PTAA), Poly(3-hexylthiophene) ("P3HT"), etc.

In some embodiments, the electrode includes gold. It could also be silver and aluminum, conductive carbon materials, or conductive oxides (indium tin oxide, metal-doped zinc oxide, reduced graphene oxide, etc).

In an exemplary embodiment, a method of generating a DNA-CTMA solution can involve dissolving deoxyribonucleic acid (DNA) in distilled water. The method can involve dissolving hexadecyl trimethyl ammonium chloride (CTMA) in distilled water. The method can involve mixing the DNA water solution and the CTMA water solution to form a DNA-CTMA mixture. The method can involve allowing an ion exchange process to occur in the DNA-CTMA mixture to form a DNA-CTMA complex. The method can involve collection of DNA-CTMA precipitates from the DNA-CTMA complex. The method can involve forming a DNA-CTMA solution by dissolving the DNA-CTMA precipitates into a solvent. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc. The perovskite is $ABX_3$ with A being amine such as MA, FA or Cs, B being Pb or Sn or other bivalent metals, and X being halogen such as Cl, Br, I.

In an exemplary embodiment, a method of generating a hybrid perovskite crystal structure can involve forming an embodiment of the DNA-CTMA solution disclosed herein. The method can involve exposing MAPbI3 perovskite crystals to $CH_3NH_2$ gas to form a liquid perovskite intermedia. The method can involve adding acetonitrile to the perovskite intermedia to form a perovskite acetonitrile solution. The method can involve adding the DNA-CTMA solution into the perovskite acetonitrile solution. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc.

Further features, aspects, objects, advantages, and possible applications of the present invention will become apparent from a study of the exemplary embodiments and examples described below, in combination with the Figures, and the appended claims.

In another example, the Artemisinin (ART) biomolecule—perovskite crystals can be combined together to achieve enhanced charge transport. Here the perovskite is $ABX_3$ with A being amine such as MA, FA or Cs, B being Pb or Sn or other bivalent metals, and X being halogen such as Cl, Br, I.

In another example, the melanin biomolecule can be combined with perovskite to achieve higher thermal transport. This allows charge carriers to become heat carriers. Here the perovskite is $ABX_3$ with A being amine such as MA, FA or Cs, B being Pb or Sn or other bivalent metals, and X being halogen such as Cl, Br, I.

In some embodiments, the method involves forming a perovskite solar cell having a light-harvesting perovskite layer comprising the hybrid perovskite crystal structure; modifying DNA length, twist, strand), or order of nucleotides to achieve band matching with a hole transport layer and a conductivity matching with the mixed perovskite; and/or using artemisinin molecules with or without DNA to improve charge transport.

In an exemplary embodiment, a perovskite-based material includes biomolecules coated around grains of a perovskite crystal structure, wherein: the biomolecules enhance light to thermal conversion by modifying thermal transport and/or the biomolecules enhance charge and thermal transport by tailoring bandgaps and by imparting band matching.

In an exemplary embodiment, a biomolecule-perovskite precursor solution includes: a filler comprising deoxyribonucleic acid (DNA), artemisinin, or a biomolecule; a matrix comprising perovskite with a general formula $ABX_3$ with A being amine, B being Pb, Sn, or other bivalent metals, and X being halogen; a solvent comprising any one or combination of acetonitrile, ethanol, tetrahydrofuran.

In an exemplary embodiment, a semiconducting smooth thin film includes a semiconducting thin film formed from an embodiment of the biomolecule-perovskite precursor solution disclosed herein, wherein the semiconducting thin film is stable.

BRIEF DESCRIPTION OF THE FIGURES

The above and other objects, aspects, features, advantages and possible applications of the present invention will be more apparent from the following more particular description thereof, presented in conjunction with the following drawings. It should be understood that like reference numbers used in the drawings may identify like components.

DETAILED DESCRIPTION OF THE INVENTION

Figure 1:
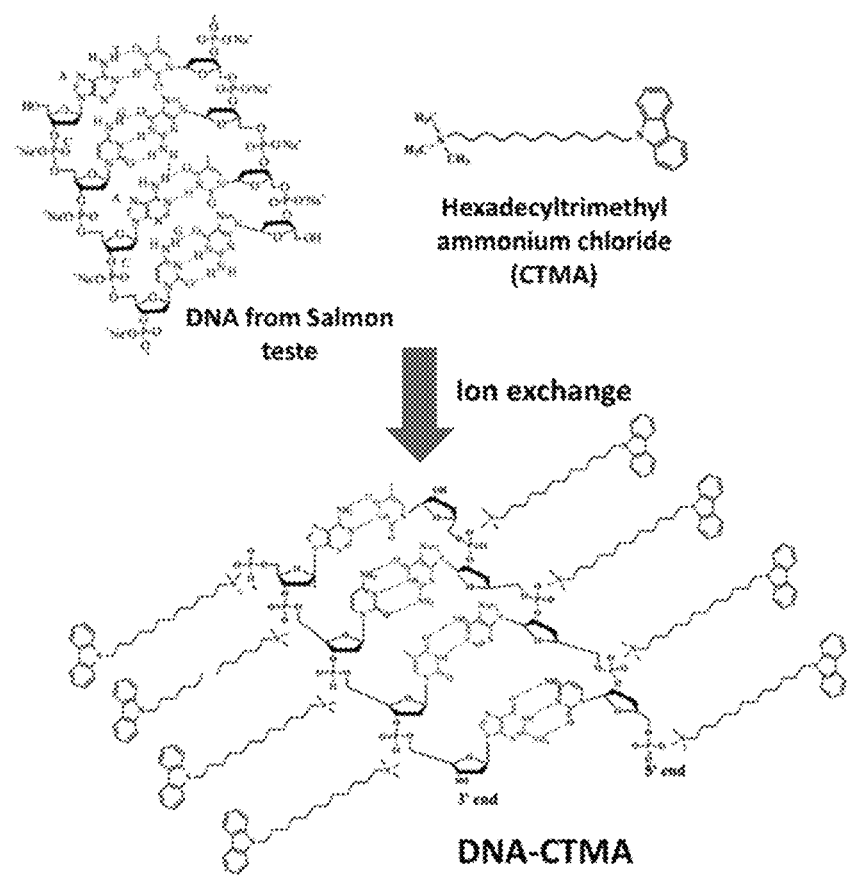
FIGS. 1-2 show an exemplary synthesis procedure for generating a DNA-CTMA structure. Here the DNA could be commercialized DNA (e.g., from salmon testes, herring sperm and calf thymus) or any lab-synthesized DNA using artificial sequencing with tunable length, twist, strand (single or double), and order of nucleotides to achieve band matching. The CTMA could be other surfactant molecules such as cetyltrimethylammonium bromide (C16, CTAB), dodecyltrimethylammonium bromide (C12, DTAB), etc.
Figure 1:
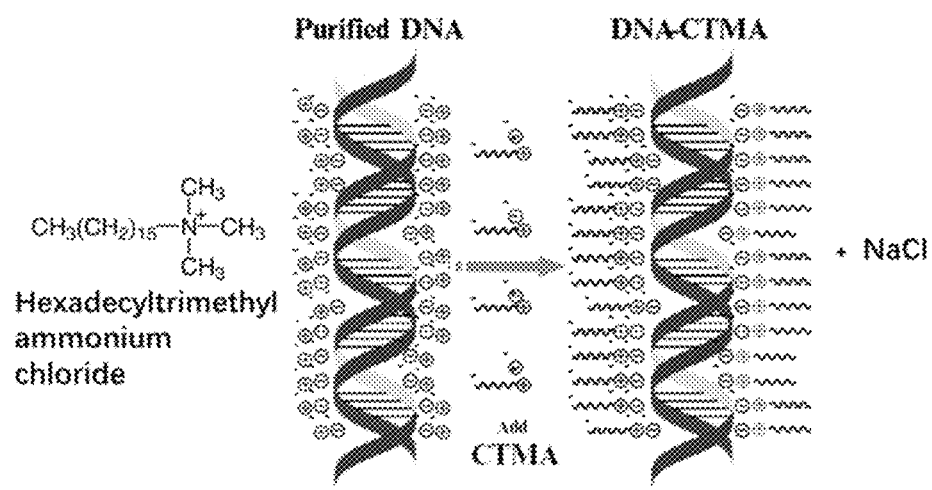

The following description is of an embodiment presently contemplated for carrying out the present invention. This description is not to be taken in a limiting sense, but is made merely for the purpose of describing the general principles and features of the present invention. The scope of the present invention should be determined with reference to the claims.

Referring to FIGS. 1-4, embodiments of the system 100 can related to a perovskite crystal based photovoltaic device (e.g., photodiode, phototransistor, photodetector, photosensor, solar cell, or any device configured to convert light into another form of energy (e.g., electricity, current, heat, etc.) using a semiconducting material that exhibits the photovoltaic effect. Some embodiments can utilize the system 100 as a means to generate photons of a desired frequency or wavelength so as to facilitate generating various electro-optic or optical devices. For instance, embodiments of the system 100 can be used to provide electrical energy (e.g., via electron/hole transport) to generate a solar cell. As another example, embodiments of the system 100 can be used to generate and direct photons into a lasing medium to generate a laser. As another example, embodiments of the system 100 can be used to generate photons to generate a light emitting diode. As another example, embodiments of the system 100 can be used to generate a high-, low-, or bandgap filter so as to serve an optical filter. Other applications can include artificial synapsis, water photolysis, x-ray detection, films to generate solar windows, etc.

In an exemplary embodiment, the system 100 is configured as a solar cell. The solar cell system 100 can include a perovskite crystal based solar cell (or a perovskite solar cell or PSC). General operating principles of a solar cell device include: 1) absorption of light by a semiconducting medium, generating either electron-hole pairs or excitons; 2) separation of charge carriers of opposite types; and 3) separate extraction of carriers to an external circuit. In an exemplary implementation, photons (e.g., sunlight) incident upon the semiconducting medium are absorbed. Electrons are excited from their current molecular/atomic orbital due to the photon absorption. The excited electrons either dissipates the absorbed energy as heat and return to their orbital or travel through the solar cell structure to an electrode. Due to this electron movement, an electric potential is created, wherein electrical current flows through the solar cell cancel the electrical potential. The electricity generated from this action is captured.

In one embodiment, the PSC system 100 includes a light-harvesting perovskite layer (PVK) 102, an electron transport layer (ETL) 104, a hole transport layer (HTL) 106, and an electrode 108. (See FIG. 3). The PVK 102 can comprise of any form of DNA and perovskite, where DNA can be commercialized DNA (e.g., from salmon testes, herring sperm and calf thymus) or any lab-synthesized DNA using artificial sequencing with tunable length, twist, strand (single or double), and order of nucleotides to achieve band matching, with or without surfactant modification by surfactant molecules such as Cetyltrimethylammonium chloride (CTMA), cetyltrimethylammonium bromide (C16, CTAB), dodecyltrimethylammonium bromide (C12, DTAB), etc., and perovskite could be $ABX_3$ with A being amine such as MA, FA or Cs, B being Pb or Sn or other bivalent metals, and X being halogen such as Cl, Br, I; The ETL 104 is usually an n-type semiconductor such as ZnO, $TiO_2$, $SnO_2$, $CeO_2$, PCBM or other fullerene derivatives, etc.; HTL 106 could be a p-type semiconductor such as NiO, $MoO_x$, poly(3,4-ethylenedioxythiophene) polystyrene sulfonate (PEDOT:PSS), Poly[bis(4-phenyl)(2,5,6-trimethylphenyl)amine (PTAA), Poly(3-hexylthiophene) ("P3HT"), etc.; The electrode 108 could be gold, silver, aluminum, conductive carbon materials, or conductive oxides (indium tin oxide, metal-doped zinc oxide, reduced graphene oxide, etc). For instance, the PSC system 100 can include a substrate 110 having a substrate first surface 110a and a substrate second surface 110b. The substrate 110 can be fluorine doped tin oxide, indium tin oxide, conducting glasses, and other transparent electrodes, for example. An ETL 104 can be disposed on at least a portion of a surface of the substrate 110. For instance, an ETL 104 can be disposed on the substrate second surface 110b. The ETL 104 can be titanium oxide, tin oxide, zinc oxide, cerium oxide, cesium oxide, and other n-type semiconductors, for example. The ETL 104 can have an ETL first surface 104a and an ETL second surface 104b. A PVK 102 can be disposed on at least a portion of a surface of the ETL 104. For instance, the PVK 102 can be disposed on the ETL second surface 104b. The PVK 102 can be $ABX_3$ composition with A being amine such as MA. FA or Cs. B being Pb or Sn or other bivalent metals, and X being halogen such as Cl, Br, I. For example, it could be $CH_3NH_3PbI_3$("MAPbI$_3$") or FAPbI$_3$. As will be explained herein, embodiments of the PVK 102 can be DNA doped MAPbI$_3$. DNA doped MAPbI$_3$ can be formed by using a deoxyribonucleic acid-hexadecyl trimethyl ammonium chloride ("DNA-CTMA") complex. Other bio-PVK composite can be melanin-perovskite, artemisinin-perovskite or other biomolecule-perovskite composite (here DNA-perovskite is used as an example for demonstration). The PVK 102 can have a PVK first surface 102a and a PVK second surface 102b. A HTL 106 can be disposed on at least a portion of a surface of the PVK 102. For instance, a HTL 106 can be disposed on the PVK second surface 102b. The HTL 106 can be 2,2',7,7'-Tetrakis[N,N-di(4-methoxyphenyl)amino]-9,9'-spirobifluorene ("Spiro-MeOTAD"), poly(3,4-ethylenedioxythiophene) polystyrene sulfonate ("PEDOT:PSS"), Poly[bis(4-phenyl)(2,5,6-trimethylphenyl)amine ("PTAA") or Poly(3-hexylthiophene) ("P3HT"), NiO, $MoO_x$, etc. and other p-type semiconductors. The HTL 106 can have a HTL first surface 106a and a HTL second surface 106b. An electrode 108 can be disposed on at least a portion of a surface of the HTL 106. For instance, an electrode 108 can be disposed on the HTL second surface 106b. The electrode 108 can be gold, silver, or aluminum, conductive carbon materials, or conductive oxides (indium tin oxide, metal-doped zinc oxide, reduced graphene oxide, for example. The PSC system 100 can be connected to an electrical circuit 112 to facilitate capture of electric energy output generated from the system 100.

In one embodiment, the PSC system 100 includes a light-harvesting perovskite layer (PVK) 102, an electron transport layer (ETL) 104, and an electrode 108. (See FIG. 4). As will be explained herein, embodiments of the system 100 can be used to generate an effective solar cell without a HTL 106. This is a significant improvement over conventional solar cell systems. For instance, the PSC system 100 can include a substrate 110 having a substrate first surface 110a and a substrate second surface 110b. The substrate 110 can be fluorine doped tin oxide and indium tin oxide, metal-doped zinc oxide, conducting glasses, and other conducting semiconductors for example. An ETL 104 can be disposed on at least a portion of a surface of the substrate 110. For instance, an ETL 104 can be disposed on the substrate second surface 110b. The ETL 104 can be titanium oxide or another n-type semiconductor such as [6,6]-phenyl-C61-butyric acid methyl ester ("PCBM") and other fullerene derivative, zinc oxide (ZnO), tin oxide (SnO$_2$), cerium oxide (CeO$_2$), for example. The ETL 104 can have an ETL first surface 104a and an ETL second surface 104b. A PVK 102 can be disposed on at least a portion of a surface of the ETL 104. For instance, the PVK 102 can be disposed on the ETL second surface 104b. The PVK 102 can be $CH_3$ $NH_3$ $PbI_3$ ("MAPbI$_3$-"). Again, embodiments of the PVK 102 can be DNA doped MAPbI$_3$. DNA doped MAPbI$_3$ can be formed by using a deoxyribonucleic acid-hexadecyl trimethyl ammonium chloride ("DNA-CTMA") complex. The PVK 102 can have a PVK first surface 102a and a PVK second surface 102b. An electrode 108 can be disposed on at least a portion of a surface of the PVK 102. For instance, an electrode 108 can be disposed on the PVK second surface 102b. The electrode 108 can be gold, silver, or aluminum, conductive carbon materials, or conductive oxides (indium tin oxide, metal-doped zinc oxide, reduced graphene oxide, for example). The PSC system 100 can be connected to an electrical circuit 112 to facilitate capture of electric energy output generated from the system 100.

Referring to FIG. 1, DNA is a molecule having two polynucleotide chains or strands that coil around each other. Each DNA strand is composed of nucleotide monomeric units. Each nucleotide has one of four nitrogen-containing nucleobases: cytosine [C], guanine [G], adenine [A] or thymine [T]). The nucleotides are joined to one another in a chain by covalent bonds (known as a phospho-diester linkage) between the sugar of one nucleotide and the phosphate of the next, resulting in an alternating sugar-phosphate backbone. The nitrogenous bases of the two separate polynucleotide strands are bound together with hydrogen bonds according to base pairing rules (A with T and C with G) to make double-stranded DNA. The complementary nitrogenous bases are divided into two groups, pyrimidines and purines. In DNA, the pyrimidines are thymine and cytosine, and the purines are adenine and guanine.

The alternating sequences of DNA provide the structure for a charge carrier (hole) transport medium. For instance, holes can hop among delocalized highest occupied molecular orbital (HOMO) orbits of G bases.

As noted herein, embodiments of the PVK 102 can be DNA doped MAPbI$_3$. DNA doped MAPbI$_3$ can be formed by using a DNA-CTMA complex. An exemplary method for creating the DNA-CTMA complex is discussed below. The DNA can be commercialized DNA (e.g., from salmon testes, herring sperm and calf thymus) or any lab-synthesized DNA using artificial sequencing. The CTMA is a surfactant modifying the DNA, which can be other surfactant molecules such as cetyltrimethylammonium bromide (C16, CTAB), dodecyltrimethylammonium bromide (C12, DTAB), etc. Each of the DNA and the CTMA can be separately dissolved in distilled water to form a DNA water solution and a CTMA water solution. The DNA water solution and CTMA water solution can be mixed with each other to form a DNA-CTMA mixture. For instance, the DNA-CTMA mixture can include equal weight concentrations of each the DNA water solution and the CTMA water solution in a 1:1 volume ratio. The DNA-CTMA mixture facilitates an ion exchange reaction (see FIG. 1) to form a DNA-CTMA complex (i.e., the DNA-CTMA complex is synthesized via an ion exchange process). Synthesizing the DNA-CTMA complex via an ion exchange process may be done to make DNA compatible with a perovskite solution so as to facilitate formation of the DNA doped MAPbI$_3$. It is contemplated for the DNA-CTMA complex to be generated in powder form. The DNA-CTMA powder can be collected via a vacuum filtration of DNA-CTMA precipitates, for example.

After the DNA-CTMA complex is formed, DNA-CTMA solutions can be generated by dissolving the collected DNA-CTMA powder into a solvent. For instance, a DNA-CTMA solution can be formed by dissolving DNA-CTMA powder into a amine solution (containing amine in solvent of ethanol, methanol, tetrahydrofuran, isopropanol, etc.).

Figure 2:
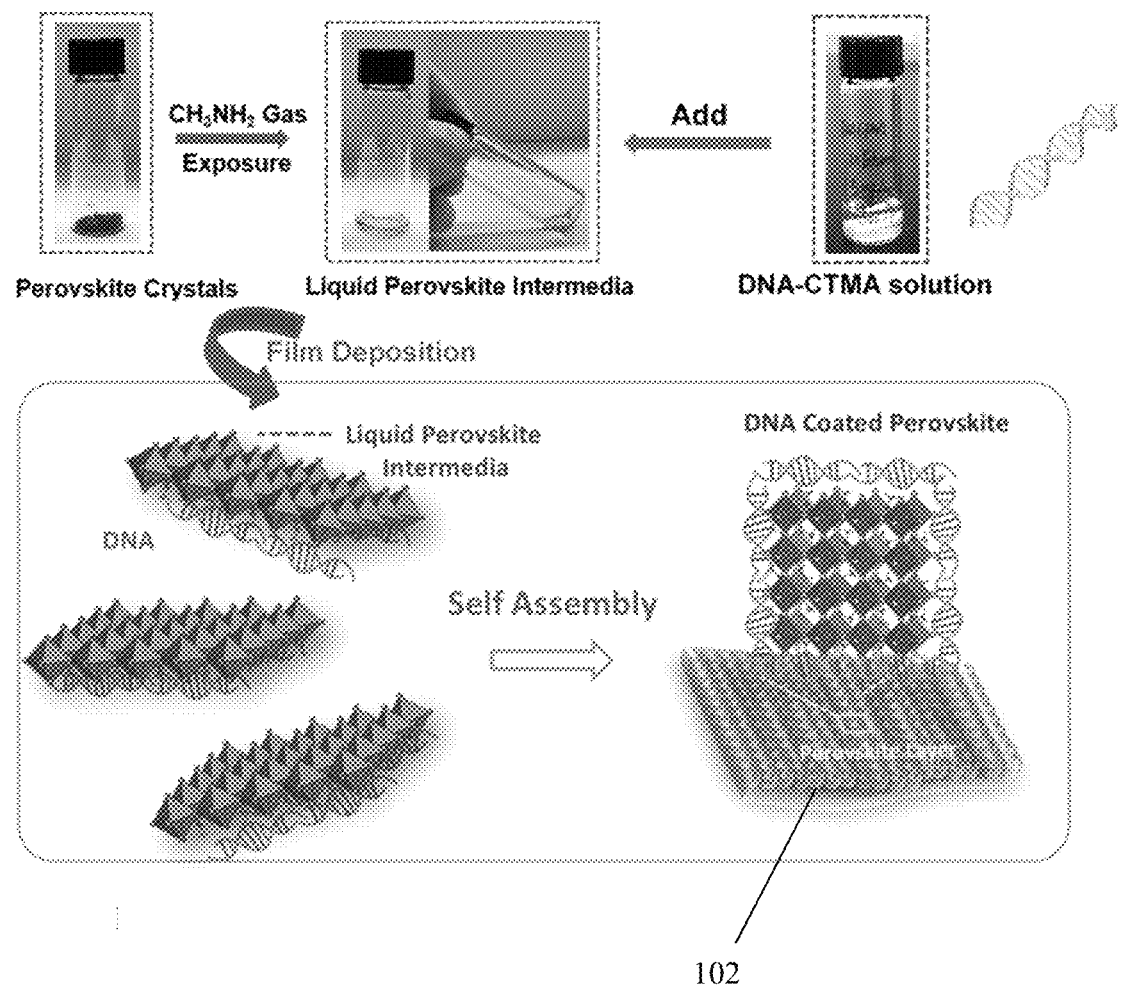

Referring to FIG. 2, after the DNA-CTMA solution is prepared, the final DNA doped MAPbI$_3$ solution can be formed which will be used for making the DNA doped MAPbI3 thin film. MAPbI3 perovskite crystals can be exposed to CH$_3$NH$_2$ gas to form a liquid perovskite intermedia. Acetonitrile can be added into the perovskite intermedia, followed by adding the same volume of DNA-CTMA solution into the perovskite acetonitrile solution to form a perovskite-DNA solution. This solution can be directly used to cast the perovskite-DNA film with a nanostructure of DNA doped MAPbI$_3$. This can be achieved via spin coating, doctor blade printing, screen printing, slot-die printing, or electrospray printing for example. The resultant structure can be used as the PVK 102 (e.g., it can serve as the photoactive layer or the light-harvesting perovskite layer in a perovskite solar cell structure).

Figure 6:
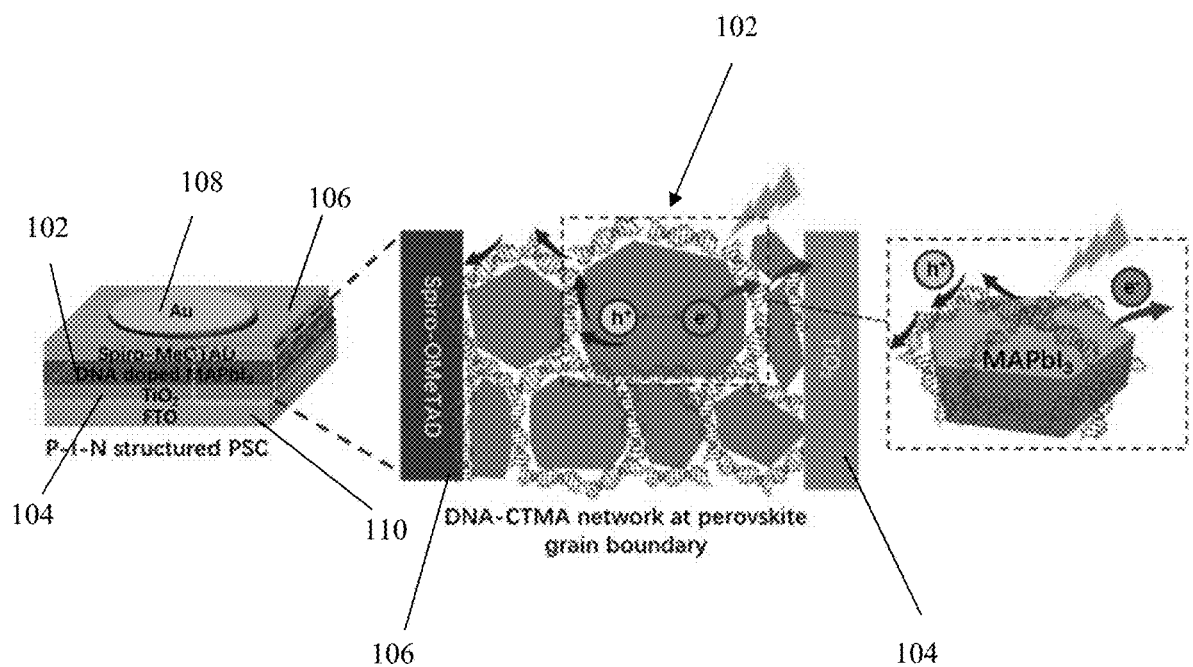
FIG. 6 shows an exemplary DNA-CTMA structure facilitating charge carrier (hole) transport.
Figure 7:
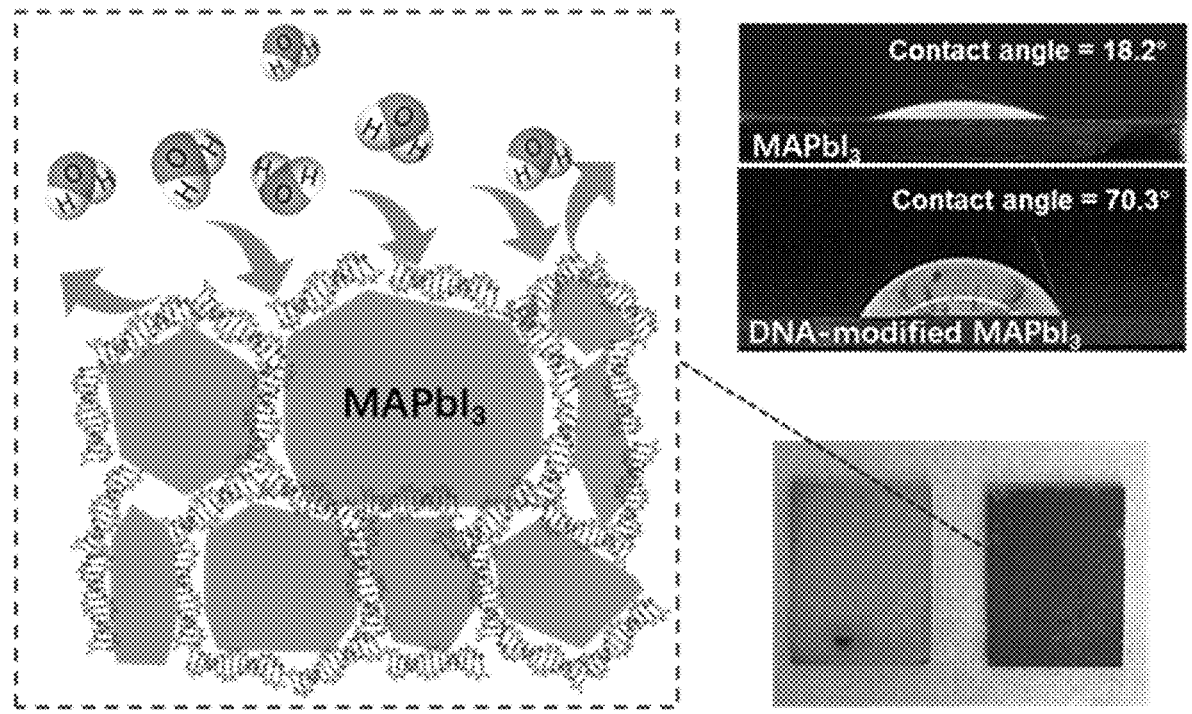
FIG. 7 shows how conventional perovskite crystals are vulnerable to humidity, and how an embodiment of the DNA-CTMA structure adequately protects the perovskite crystal from humidity.
Figure 8:
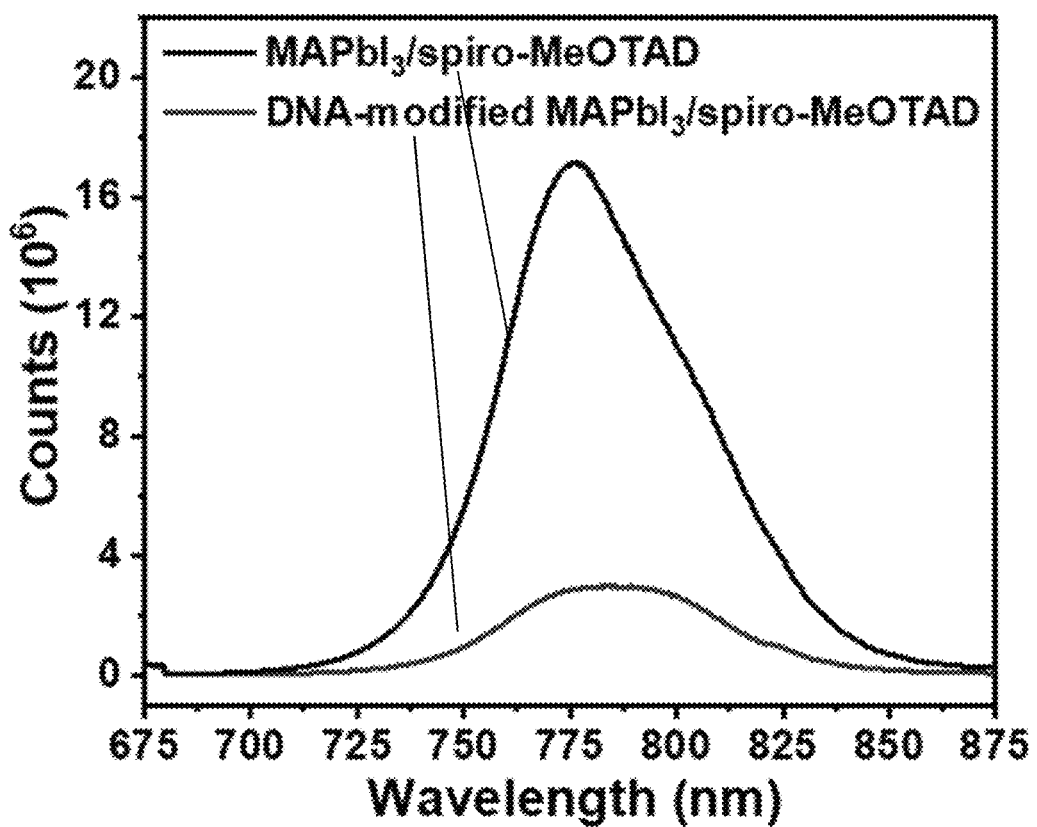
FIG. 8 is a steady-state spectra from photoluminescence (PL) spectroscopy characterizing the hole-extraction behavior between a pristine perovskite/HTL and a DNA-perovskite/HTL structure.
Figure 9:
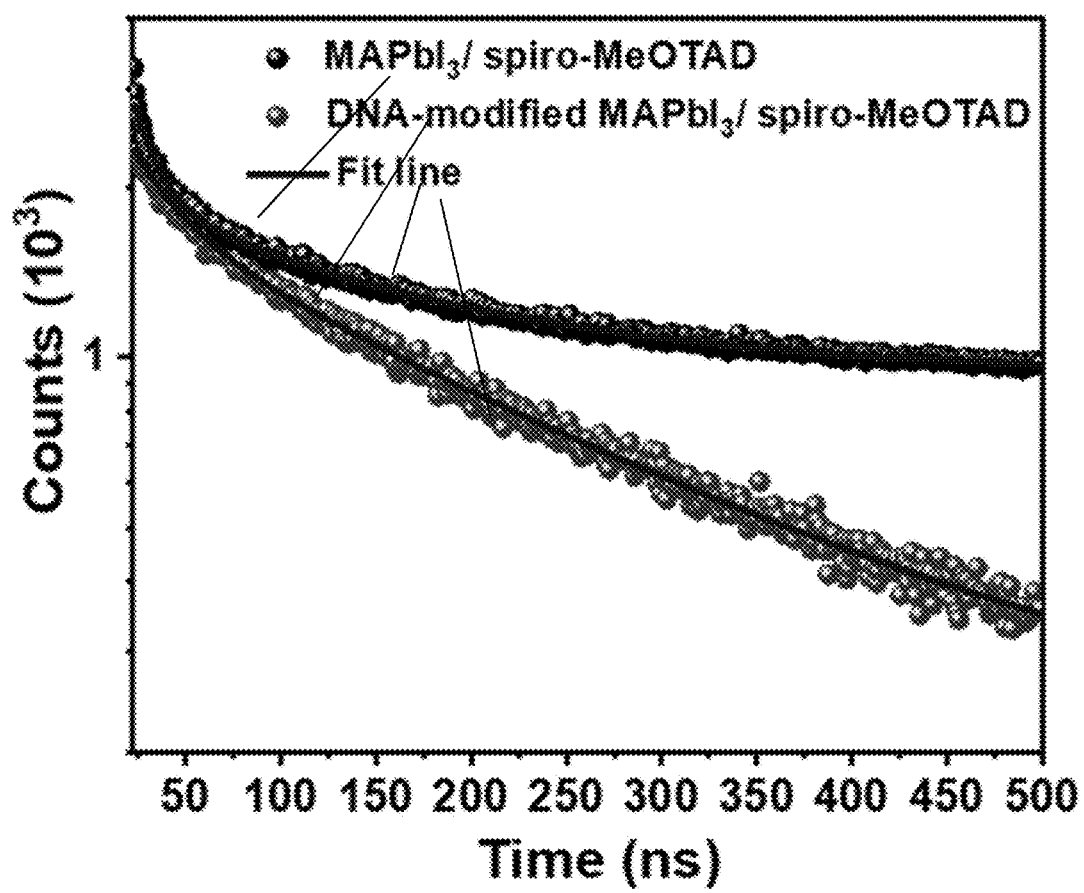
FIG. 9 is time-resolved spectra from photoluminescence (PL) spectroscopy.

Preparing a perovskite-DNA solution for film deposition is beneficial during film crystallization process. DNA molecules form an ordered coating over the perovskite crystals via self-assembly. Specifically, methylamine molecules intercalate into the 3D structured perovskite and result in collapse of 3D framework to form 2D layered perovskite intermediate. DNA-CTMA in the solution will attach to the layered intermediate as seen in FIG. 2. During the film formation process, the DNA-wrapped perovskite intermediate will easily assemble into a DNA-PVK heterostructure with a "core-shell" configuration as seen in FIG. 2. The PVK 102 is a DNA-PVK heterostructure. The multi-functional groups in DNA provide the binding sites to the perovskite crystal to generate a strong bond for the DNA-PVK heterostructure. As seen in FIGS. 2 and 6-7, the DNA wraps around the MAPbI$_3$ at the grain boundary. As will be explained herein, this enhances hole mobility and passivates traps in the perovskite.

Figure 3:
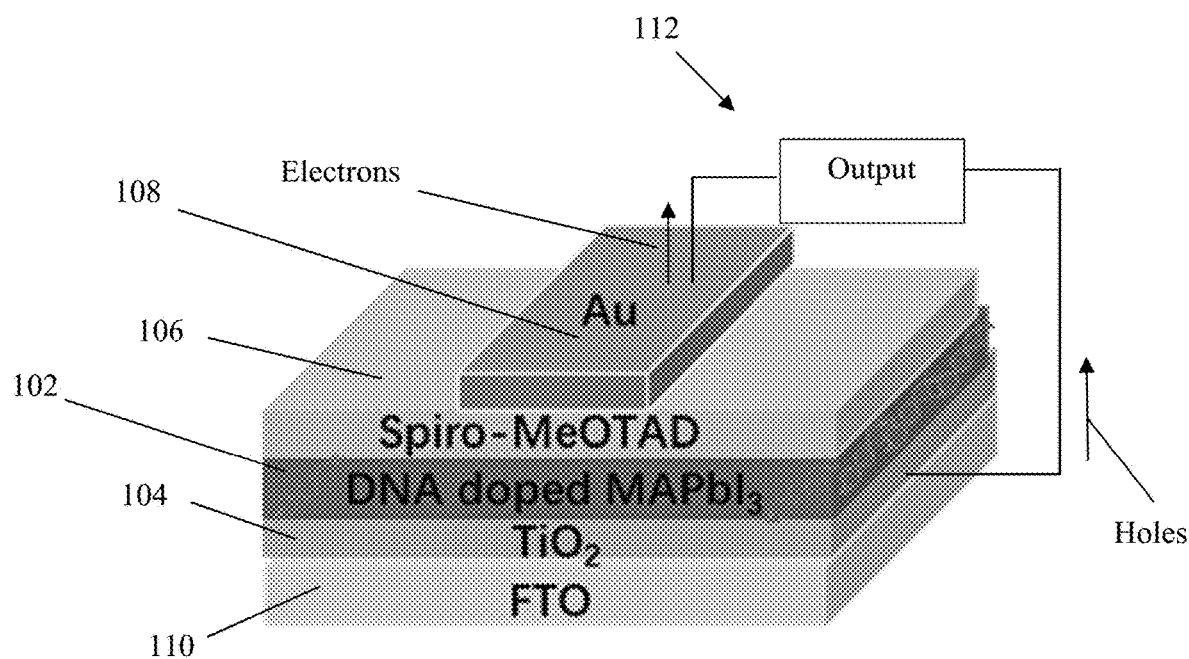
FIG. 3 shows an exemplary solar cell structure configured as an N—I—P structured solar cell, along with a cross-sectional image thereof.
Figure 3:
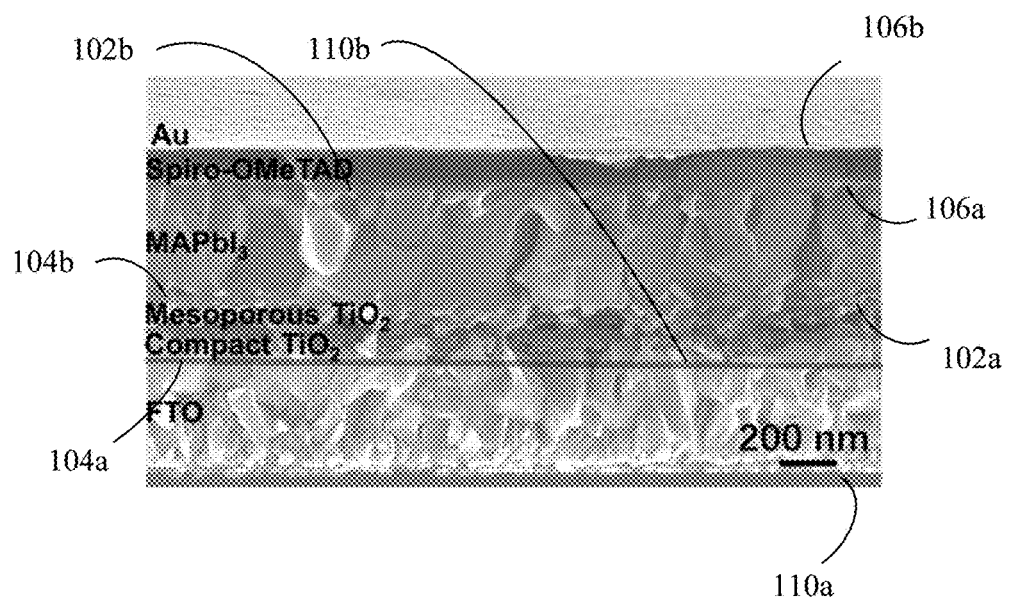
Figure 4:
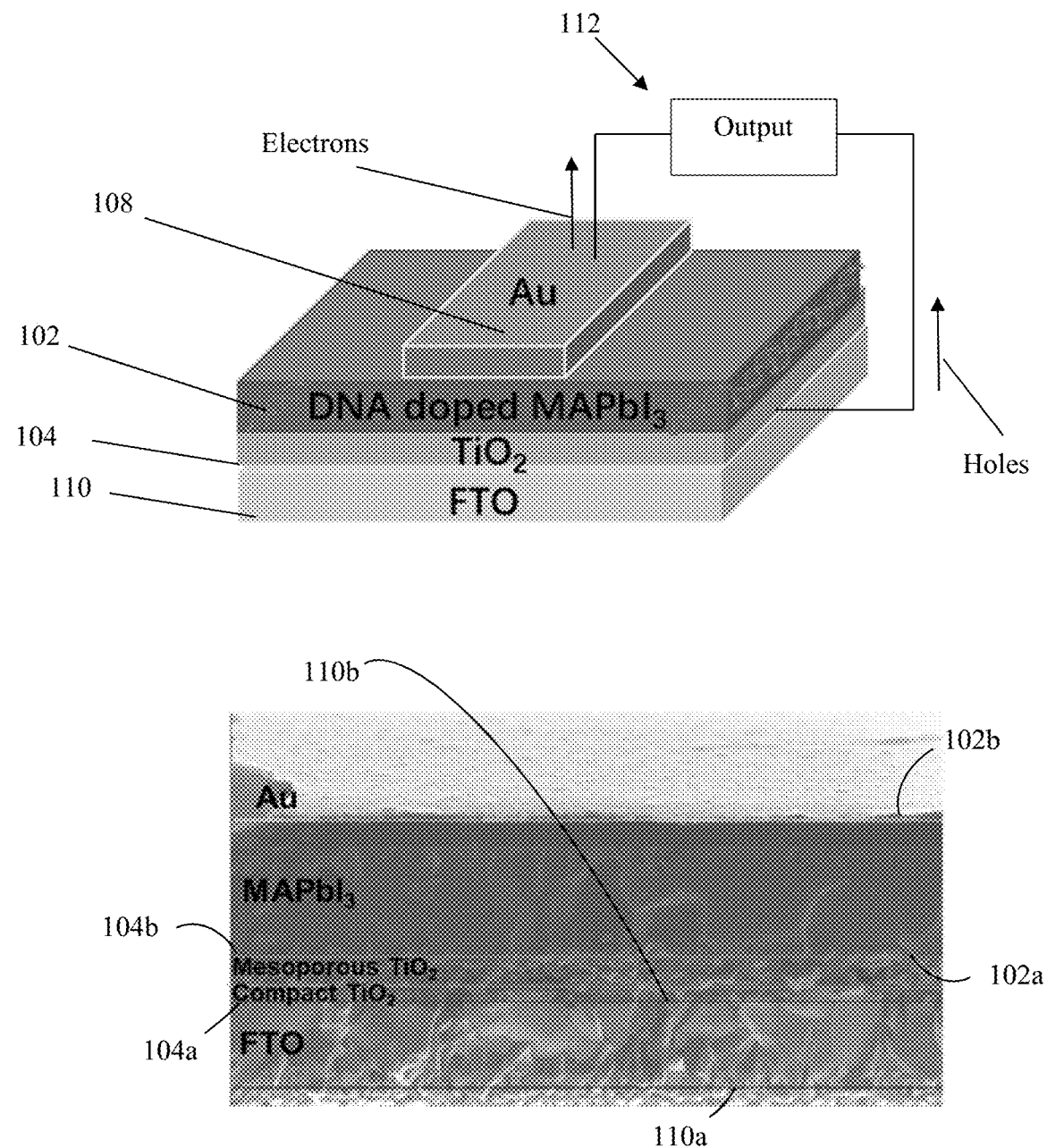
FIG. 4 shows an exemplary solar cell structure configured as an HTL-free structured solar cell, along with a cross-sectional image thereof.

Referring to FIGS. 3-4, embodiments of the PVK 102 can be used to generate various types of PSC system 100. FIG. 3 shows an exemplary PSC system 100 formed with an N—I—P structure. It should be noted that the PSC system 100 can also be formed with a P—I—N structure. An N—I—P structured solar cell is illuminated through the ETL 104 side, whereas a P—I—N structured solar cell is illuminated through HTL 106 side. FIG. 4 shows an exemplary PSC system 100 formed with an HTL-free structure. Each of these PSC systems 100 can be formed by spin coating fabrication techniques. For instance, a small amount of PVK film can be deposited onto a substrate (e.g., the ETL second surface 104*b*). The PVK film can be applied to a center portion of the substrate. The substrate can then be caused to rotate (or spin) at high speed to spread the PVK film by centrifugal force. It is contemplated for the thickness of the PVK 102 layer to be approximately in the range between 100 nm-1 µm. Crystal growth, doping, etching, deposition, etc. techniques commonly used in the art can be employed to form the other layers (substrate 110, ETL 104, HTL 106, electrode 108, etc.) and fabricate the PSC system 100.

Referring to FIG. 6, the DNA-CTMA within the PVK 102 facilitates charge carrier (hole) transport from the MAPbl$_3$ perovskite crystal to the DNA-CTMA in a HTL-free structured PSC system 100. The DNA-CTMA network in the PVK 102 serves as an efficient hole conduit/medium/material that enhances hole separation (e.g., hole extraction from MAPbl$_3$) and facilitates transfer, allowing for the formation of a high-performance HTL-free PSC systems 100.

The DNA-CTMA within the PVK 102 facilitates charge carrier (hole) transport from the MAPbl$_3$ perovskite crystal to the DNA-CTMA and then to the HTL 106 (e.g., Spiro McOTAD) in a N—I—P structured PSC system 100 (i.e., the DNA-CTMA serves as an efficient bridge to extract and conduct holes into the HTL 106).

Referring to FIG. 7, perovskite crystals are generally highly vulnerable to humidity, especially at the grain boundaries. DNA-CTMA within the PVK 102, however, is hydrophobic. Thus, a PSC system 100 made with an embodiment of the PVK 102 generates a stable PSC system 100 due to the DNA-CTMA acting as a barrier to protect the perovskite from water attack.

Figure 5:
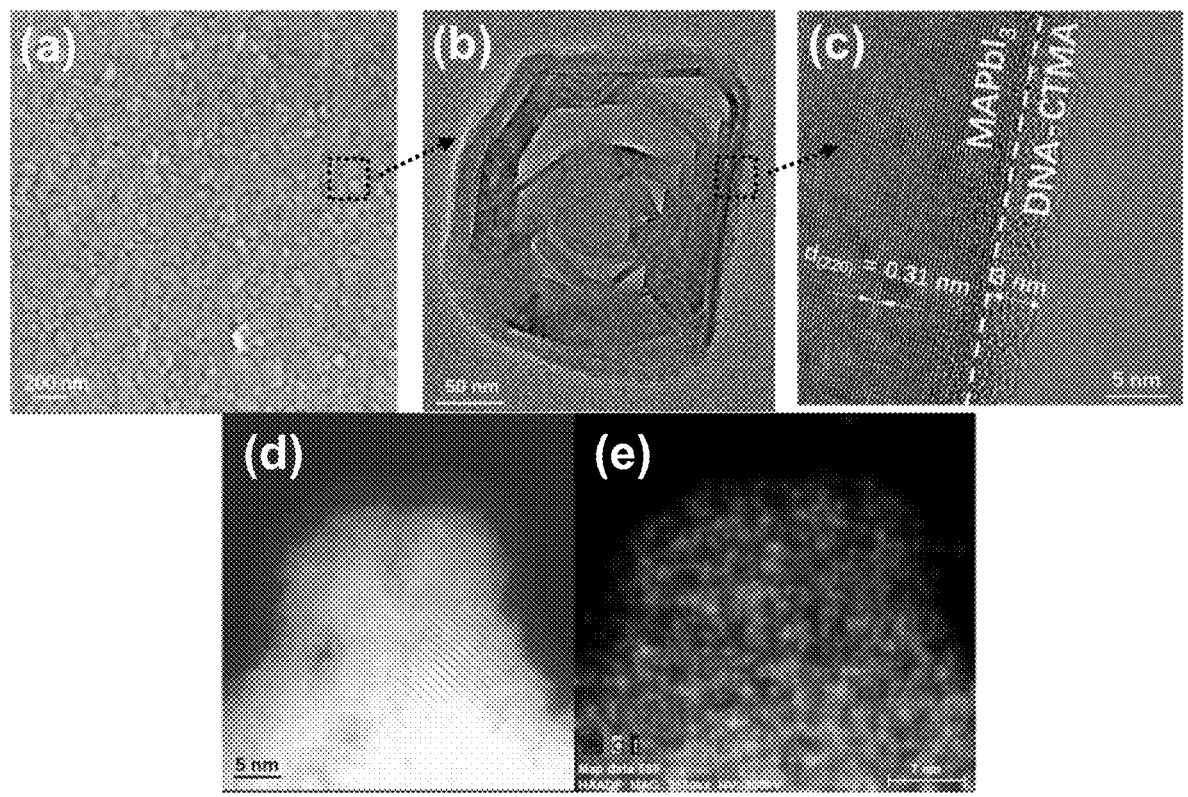
FIG. 5 shows the micromorphology of an embodiment of a DNA-PVK structure. Image (a) is a SEM image of a DNA-perovskite film surface. Image (b) is a TEM image of a DNA-perovskite crystal. Image (c) is a TEM image showing a coherent interface existing between the DNA coating and the perovskite crystal. Image (d) is a HAADF TEM image of DNA-coated perovskite crystal. Image (e) is an elemental mapping showing the Pb and I elements presented in perovskite at the core with only C elements in the DNA coating.

FIG. 5 shows the microstructure of PVK 102 material. FIG. 5A shows a scanning electron microscope (SEM) image of a top surface of PVK 102 material. Due to the confinements of the outer DNA molecules, the crystal size of perovskite is around 100 nm, which is smaller than the conventional perovskite crystal grains. FIGS. 5B-5C show high-resolution transmission electron microscopy (HRTEM) images of PVK 102 material. These figures clearly show a coherent interface formation between amorphous DNA-CTMA and CH$_3$NH$_3$PbI$_3$ (MAPbI$_3$) crystals, where the ~3 nm thick DNA molecules is coated over the perovskite grains, forming a core-shell structure. To identify the composition of the complex, elemental mapping was performed, as shown in FIGS. 5D-5E. The inner crystal presents elements of Pb, C and I, which is consistent with the composition of CH$_3$NH$_3$PbI$_3$ perovskites, while the outer layer only shows C without Pb, and I, indicating that the DNA molecules are coated over perovskite grains. This PVK 102 structure serves as an efficient conductor to transfer photogenerated charges, especially holes, to the electrode 108 of the PSC system 100.

Figure 10:
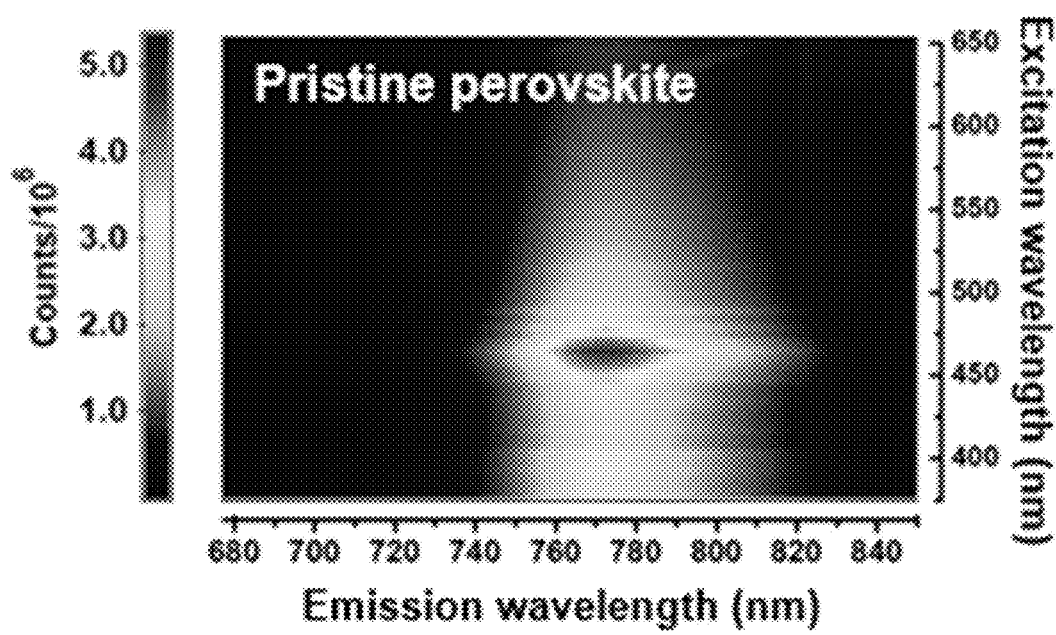
FIG. 10 shows a PL emission mapping within visible light excitation of a pristine perovskite/HTL layer structure.
Figure 11:
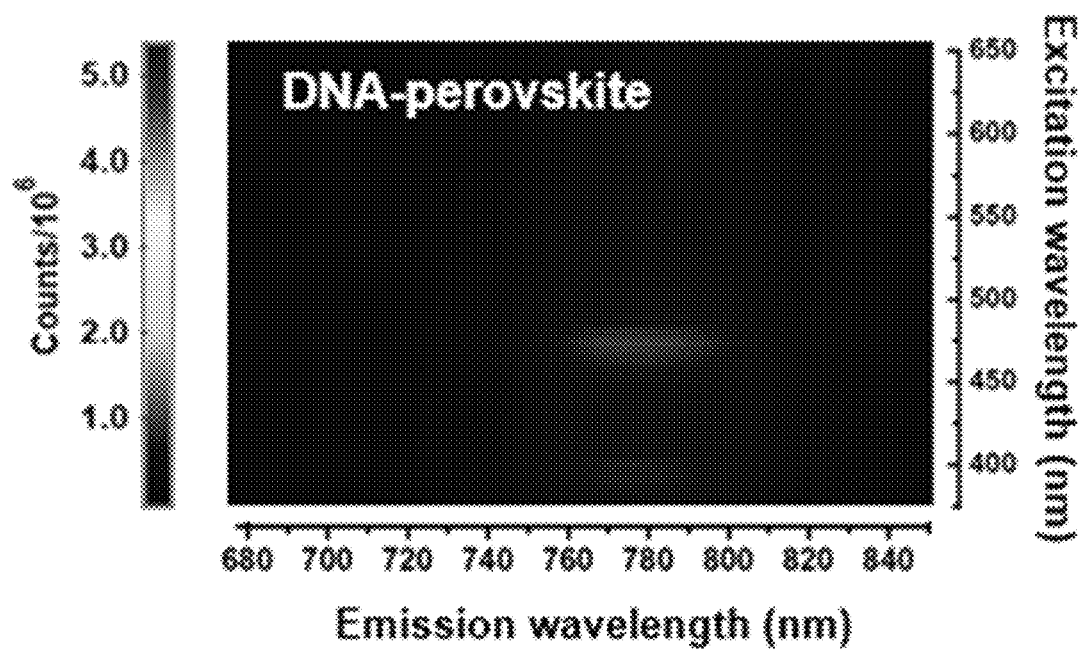
FIG. 11 shows a PL emission mapping within visible light excitation of a DNA-perovskite/HTL layer structure.

Referring to FIGS. 8-11, Photoluminescence (PL) spectroscopy was used to characterize the hole-extraction behavior between a pristine perovskite/HTL structure and DNA-perovskite/HTL structure. As shown in the stead-state PL spectra (see FIG. 8), there is a significant PL quenching for the DNA-perovskite/HTL compared with the pristine perovskite/HTL due to the hole extraction from perovskite to DNA. Since the DNA is the p-type molecules, the holes can transport through the DNA helix strand by hopping between the bases. In the PVK 102 structure, the outer DNA layer can effectively extract the holes from the excited perovskite, facilitating the charge carrier transport within the perovskite layer. The time-resolved PL spectra of FIG. 9 can be used to calculate the lifetime of the charge carries. The lifetime of photogenerated carrier within the DNA-perovskite/HTL structure is approximately a half of that within the pristine perovskite/HTL structure (see Table 1), indicating a fast transfer of charge carriers out from perovskite into HTL layers. The enhanced hole extraction feature within the DNA-perovskite/HTL structure, which may be a result of coherent DNA coating at perovskite surface serving as an efficient charge transfer bridge, can be beneficial for improving photovoltaic performance of perovskite solar cells. In addition, the hole extraction performance of the DNA-perovskite/HTL structure is enhanced within the majority of sunlight spectrum, as shown in FIGS. 10 (pristine perovskite/HTL) and 11 (the DNA-perovskite/HTL structure), where the PL quenching behavior due to enhanced hole extraction is apparent for excitation light of different wavelength within the visible range.

TABLE 1

Parameters of TRPL measurement for pristine and DNA-perovskite coupled with spiro-MeOTAD layer

| Samples | $\tau_{ave}$ [ns] | $\tau_1$ [ns] | $\tau_2$ [ns] | % of $\tau_1$ | % of $\tau_2$ |
|---|---|---|---|---|---|
| Pristine perovskite | 212.64 | 26.14 | 221.57 | 4.57 | 95.43 |
| DNA-perovskite | 137.89 | 13.77 | 148.17 | 7.65 | 92.35 |

Figure 12:
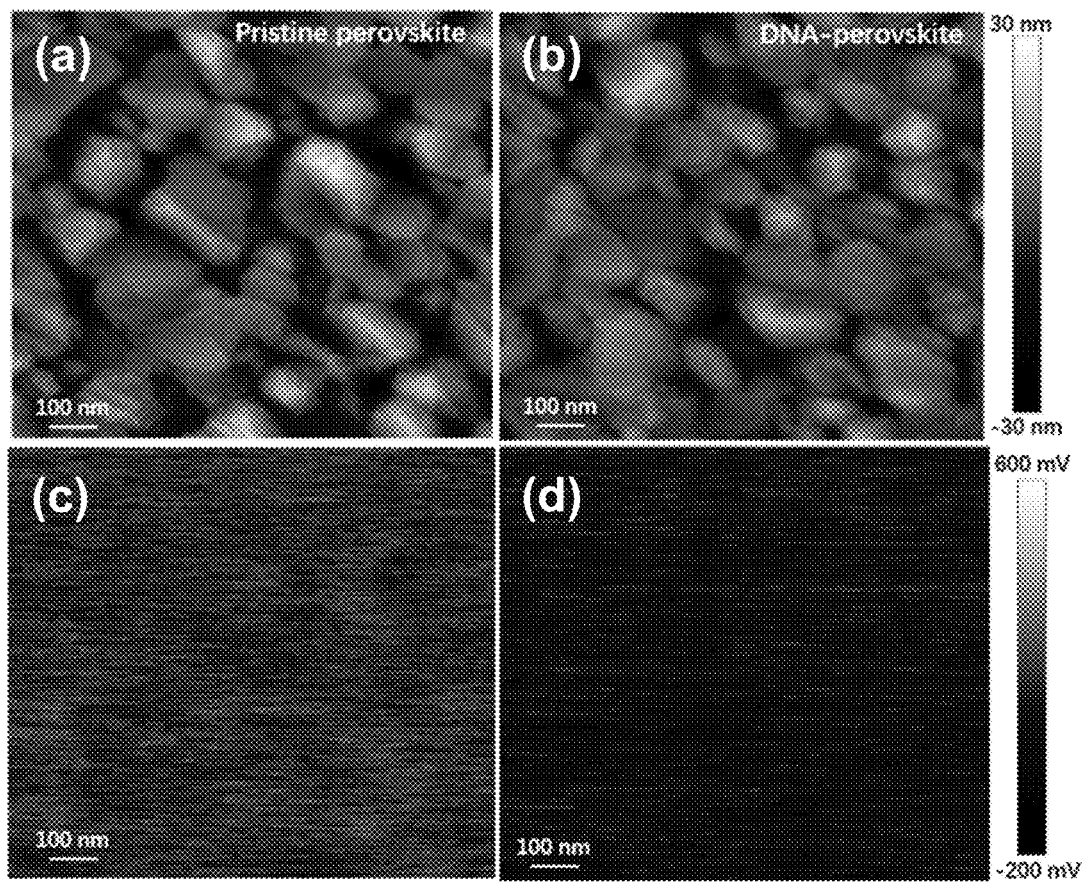
FIG. 12 shows surface topologies for a pristine perovskite (images (a) and (c)) and for a DNA-perovskite film (images (b) and (d)).
Figure 13:
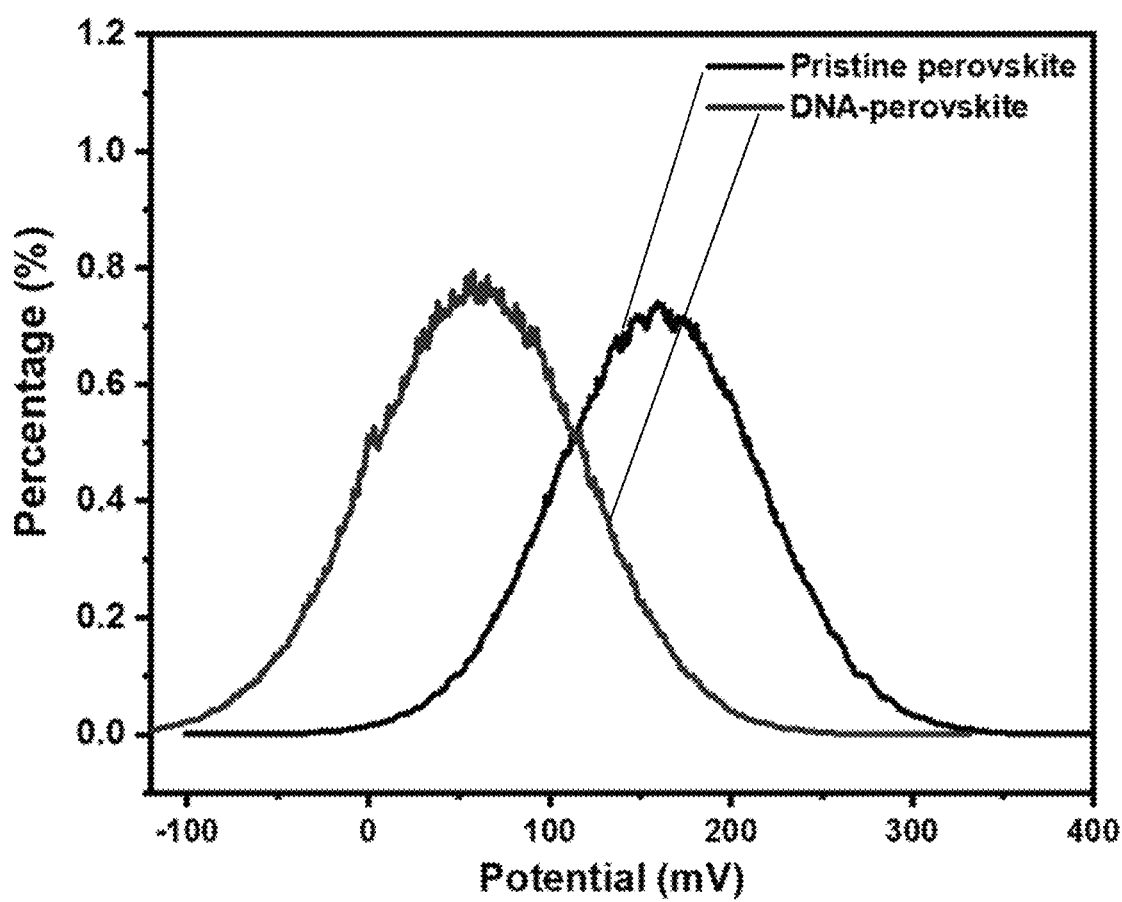
FIG. 13 shows surface potential profiles for pristine perovskite and DNA-perovskite.

Referring to FIGS. 12-13, the surface potential of the PVK 102 film was characterized by Kelvin probe force microscopy (KPFM). A decrease of the surface potential is observed for DNA-perovskite compared with pristine perovskite, suggesting that the work function is increased upon the inducing of DNA molecules. This confirms p-type doping of MAPbI$_3$ after being coupled with DNA. The p-type perovskite can form a p-n heterojunction within the perovskite layer, which enables the fabrication of highly efficient HTL-free solar cell device. For conventional N—I—P structured solar cell, the p-type perovskite may also facilitate hole transfer from perovskite to HTL material and eventually improve performance.

Figure 14:
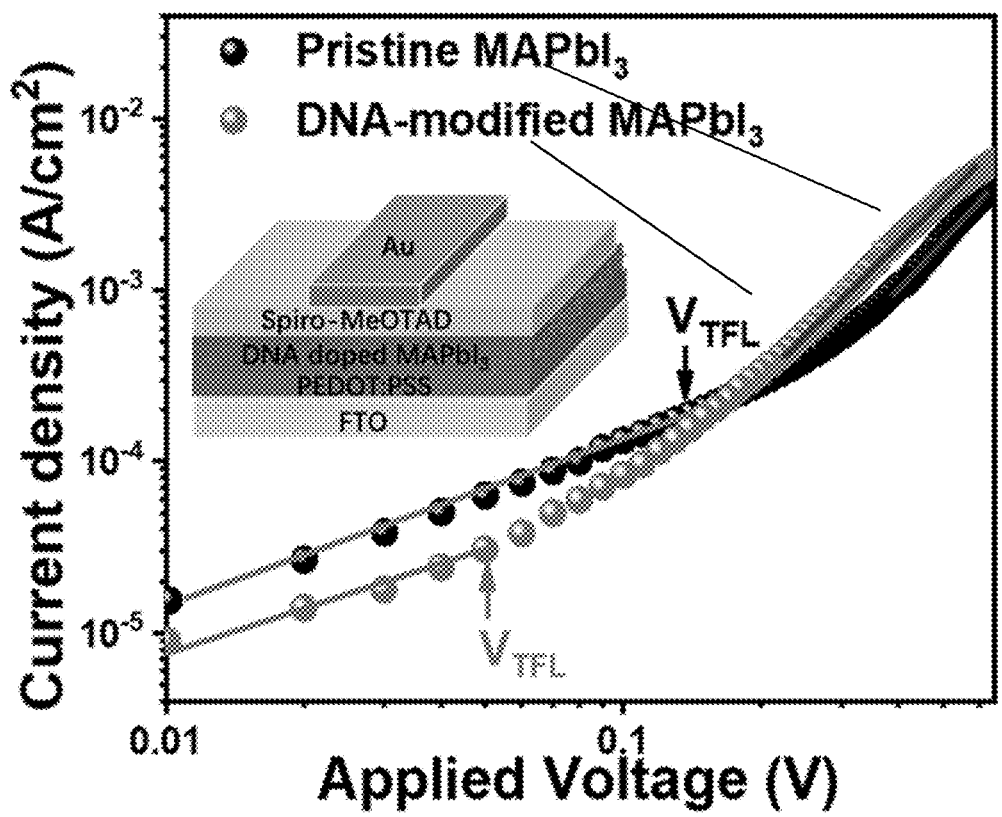
FIG. 14 is a Dark J-V curve of a hole-only device with VTFL kink points.
Figure 15:
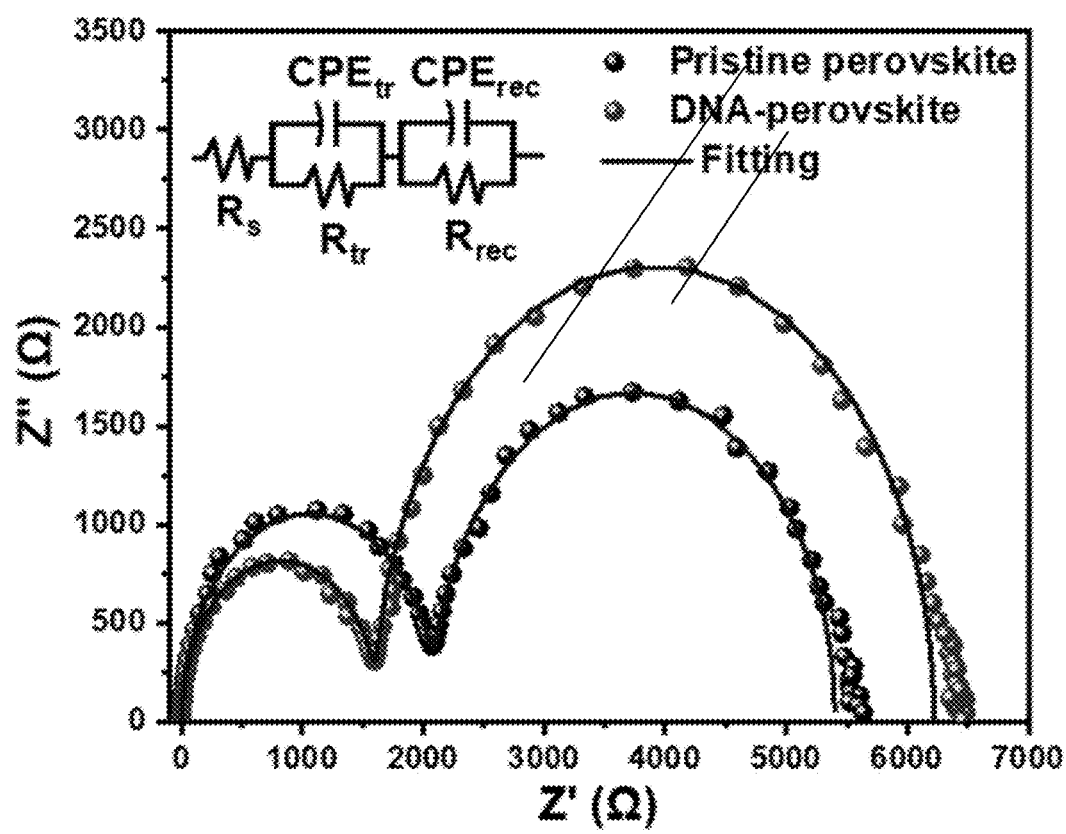
FIG. 15 is an EIS spectra of an N—I—P structured PSC based on pristine and DNA-perovskite materials.
Figure 16:
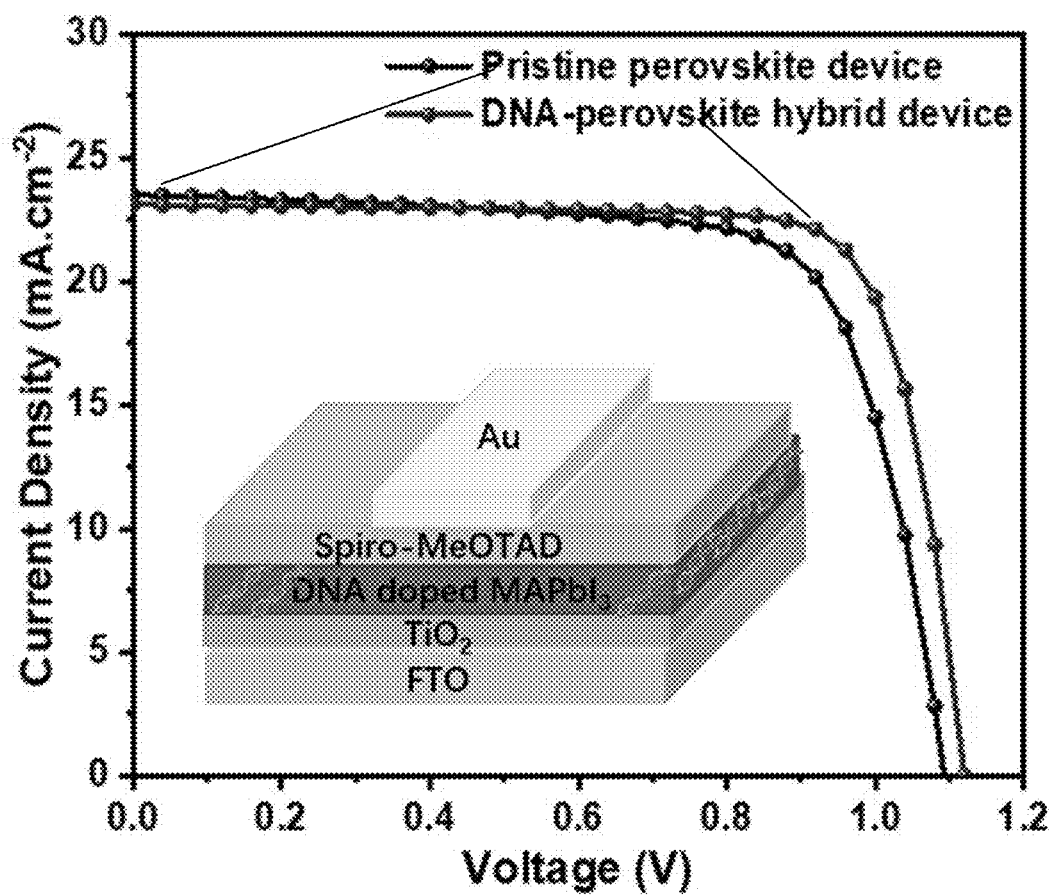
FIGS. 16-17 show the J-V characteristics of N—I—P and HTL-free solar cell devices based on pristine perovskite and hybrid DNA-perovskite materials under simulated sunlight illumination.
Figure 17:
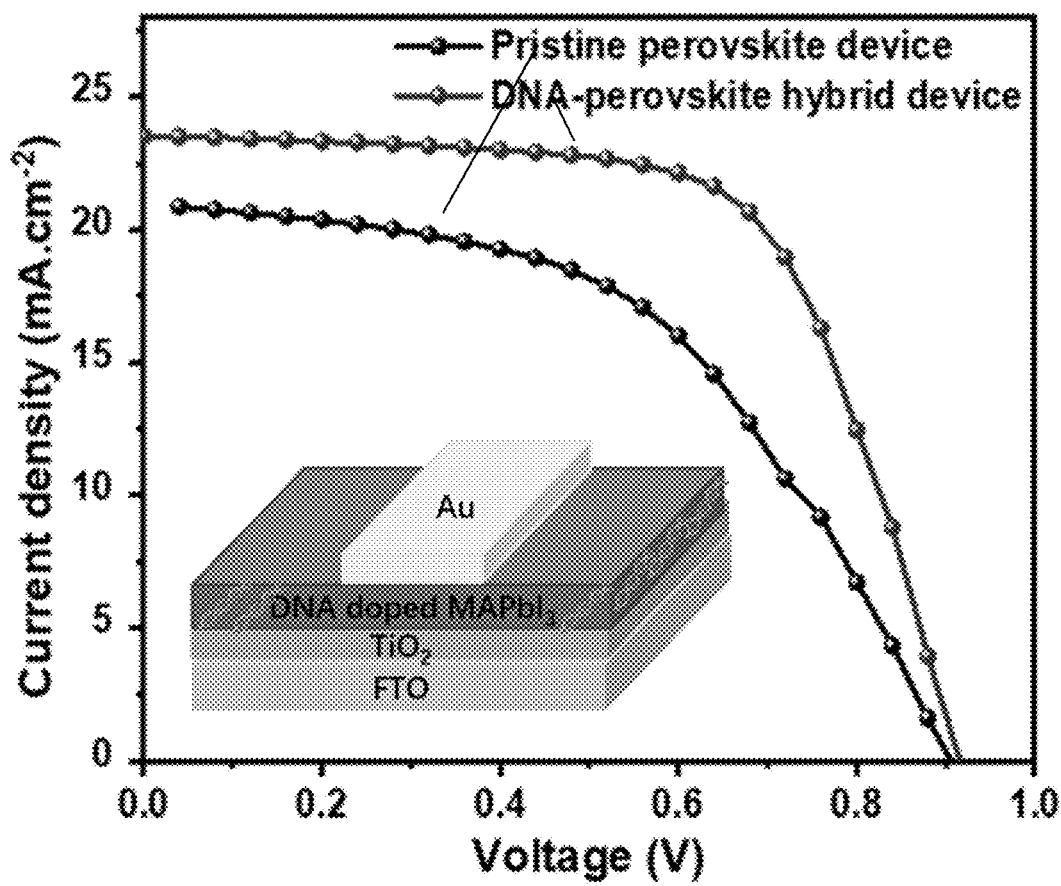

Referring to FIGS. 14-15, charge transfer characteristics, including hole mobility and charge transfer resistance of the perovskite material, was measured by space-charge-limited current (SCLC) method and electrochemical impedance spectroscopy (EIS), respectively. As DNA is assumed to be a hole transport material, a hole-only device, as shown inset of FIG. 14, was constructed for SCLC measurement. For a DNA-perovskite device, the hole mobility of DNA-perovskite is calculated to be $1.14 \times 10^{-3}$ cm$^2$ V$^{-1}$ s$^{-1}$, which is nearly two times higher compared with that of pristine perovskite ($5.62 \times 10^{-4}$ cm$^2$ V$^{-1}$ s$^{-1}$). The enhanced hole mobility of the perovskite layer facilitates charge transfer in the solar cell structure and hence is expected to improve the conversion efficiency. Trap density is calculated based on the trap-filled voltage ($V_{TFL}$) in the J-V curve. For the DNA-perovskite, the trap density was $3.06 \times 10^{14}$ cm$^3$, which is three times lower than that of pristine perovskite ($9.49 \times 10^{14}$). The decreased trap density is ascribed to the trap passivation by bonding of DNA with perovskite, which can reduce the photogenerated charge recombination, and leads to the improvement of photovoltaic performance.

The reduced charge recombination loss and enhanced charge transfer are further evidenced by Electrochemical Impedance Spectroscopy (EIS) measurement of a full solar cell device. FIG. 15 shows the Nyquist plot through EIS. The charge transfer resistance (Rtr) and charge recombination resistance (Rrec) can be obtained by fitting the plot with the equivalent circuit model. The DNA-perovskite solar cell exhibits enhanced charge transfer, as characterized by its lower Rtr (1596.9Ω) compared with that of pristine perovskite solar cell (2061.2Ω), as shown in Table 2. In addition, the DNA-perovskite solar cell shows larger charge recombination resistance (e.g., 4625Ω) compared with that of pristine perovskite device (e.g., 3332.4Ω), indicating reduced charge carrier recombination. The enhanced charge carrier transfer kinetics for DNA-perovskite is consistent with the results measured by SCLC method.

TABLE 2

EIS fitting parameters for pristine and DNA-perovskite solar cell devices

| Samples | $R_s$ [Ω] | $R_{tr}$ [Ω] | $R_{rec}$ [Ω] | $CPE_{tr}$ [F] | $CPE_{rec}$ [F] |
|---|---|---|---|---|---|
| Pristine perovskite | 52.26 | 2061.2 | 3332.4 | $8.03 \times 10^{-7}$ | $6.80 \times 10^{-9}$ |
| DNA-perovskite | 46.27 | 1596.9 | 4625 | $7.09 \times 10^{-9}$ | $7.69 \times 10^{-7}$ |

Figure 18:
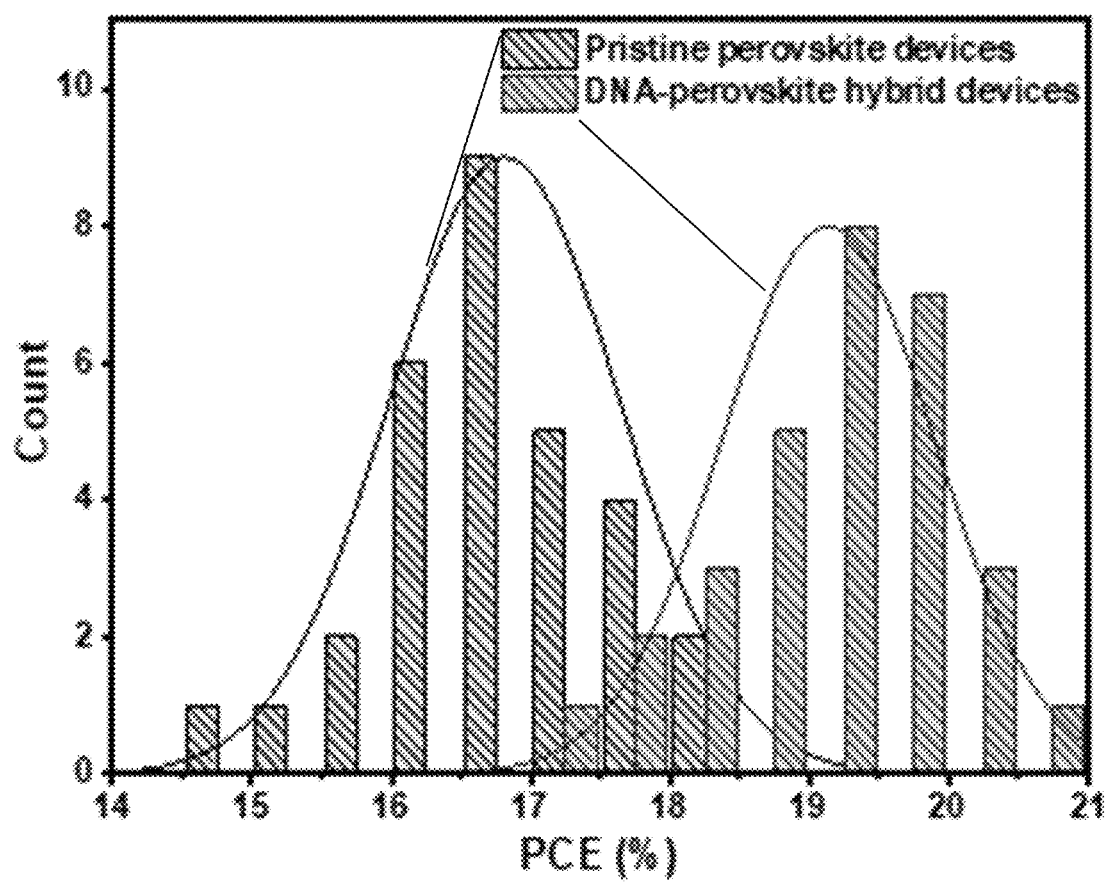
FIGS. 18-19 show statistics of PCE distributions of N—I—P and HTL-free solar cell devices based on pristine perovskite and hybrid DNA-perovskite materials.
Figure 19:
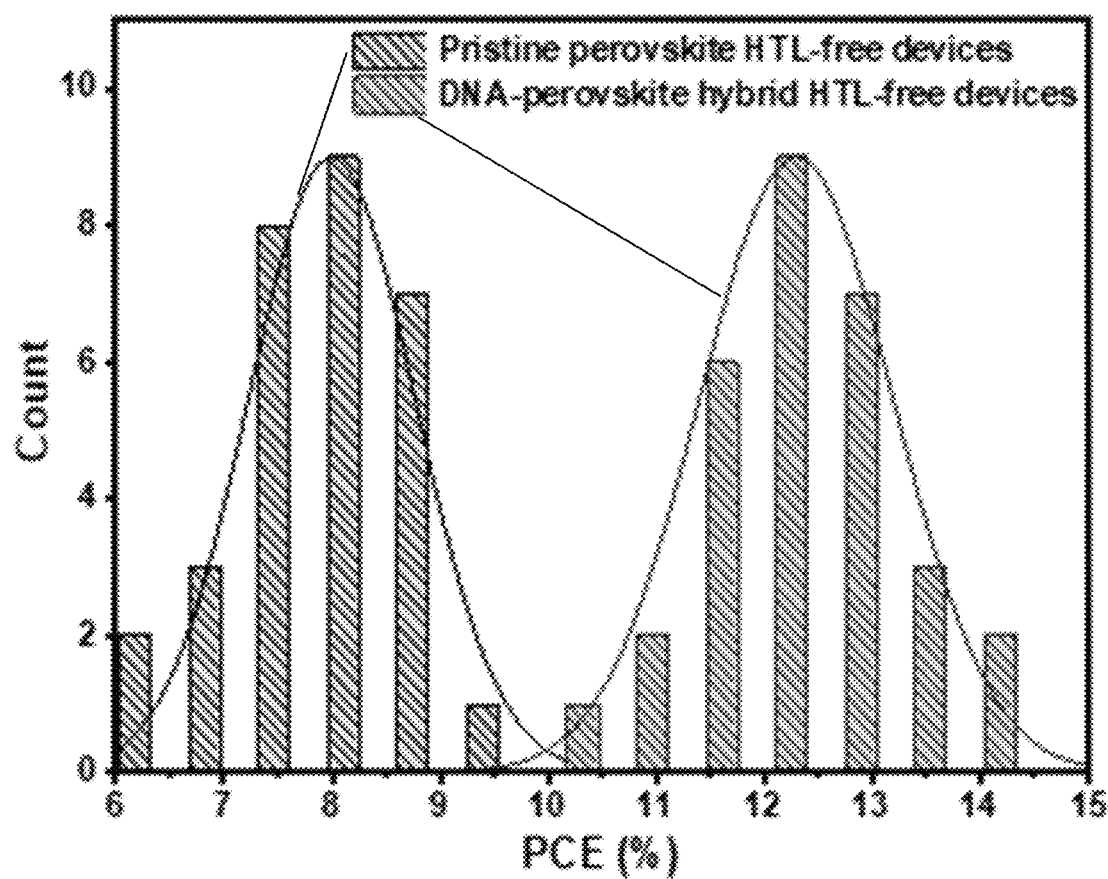

Referring to FIGS. 16-19 and Tables 3-4, the photovoltaic performance of the solar cell is characterized by the J-V curves of devices under simulated sunlight illumination (standard AM 1.5G condition). Performance parameters, including power conversion efficiency (PCE), can then be calculated, as shown in Table 1 and 2. In both the conventional N—I—P and HTL-free solar cells, the DNA-perovskite hybrid device exhibit higher PCE, which is mainly attributed to the improved fill factor (FF) of solar cell. Such increase in FF indicates an improved extraction and transfer capability of photogenerated charge within DNA-perovskite hybrid devices. Especially, for the HTL-free solar cell device, there is a significant performance improvement when DNA is used to modify perovskite materials, with a 46% PCE increase from 9.59% to 14.05%. FIGS. 18-19 show the PCE distribution histogram based on statistics of 30 devices, where the consistency in PCE improvement for DNA-modified devices can be observed.

TABLE 3

Device performance of N-I-P structured solar cell based on pristine perovskite and DNA-perovskite hybrid material

| Solar cell | $J_{sc}$ [mA·cm$^{-2}$] | $V_{oc}$ [V] | FF [%] | PCE [%] |
|---|---|---|---|---|
| Pristine perovskite | 23.53 | 1.093 | 72.7 | 18.43 |
| DNA-perovskite | 23.46 | 1.120 | 78.9 | 20.63 |

TABLE 4

Device performance of HTL-free solar cell based on
pristine perovskite and DNA-perovskite material

| Solar cell | $J_{sc}$ [mA·cm$^{-2}$] | $V_{oc}$ [V] | FF [%] | PCE [%] |
|---|---|---|---|---|
| Pristine perovskite | 20.98 | 0.906 | 50.4 | 9.59 |
| DNA-perovskite | 23.52 | 0.916 | 65.2 | 14.05 |

Additional benefits from embodiments of the PSC system 100 include:

(I) Low-cost: The DNA can be from Salmon testes, which is a waste of fishing industry, and is commercially available at low cost.

(II) Simple method: The DNA can be purchased without any treatment. No significant changes are added in the fabrication process flow of conventional perovskite solar cell (PSC). The inventive method can be easily integrated into current PSC fabrication process.

(III) Improved efficiency: The hole-extraction layer (HTL) material (e.g, spiro-OMeTAD) is expensive. Conventional HTL-free PSC devices often suffer problems associated with low PCE. With embodiments of the PSC system 100, however, the performance the HTL-free device can be vastly enhanced to an acceptable level.

(IV) Research potentials in relative field: DNA can form coherent interface with perovskite materials via self-assembly. Such a feature can be further utilized to fabricate other DNA-based devices such as detectors, light emitting device, etc.

(V) Versatility of DNA materials: Properties of DNA may be "programmed" by modifying the sequencing of nucleobases or by changing the length of DNA chain by cleaving to meet the requirement in different device applications.

Figure 20:
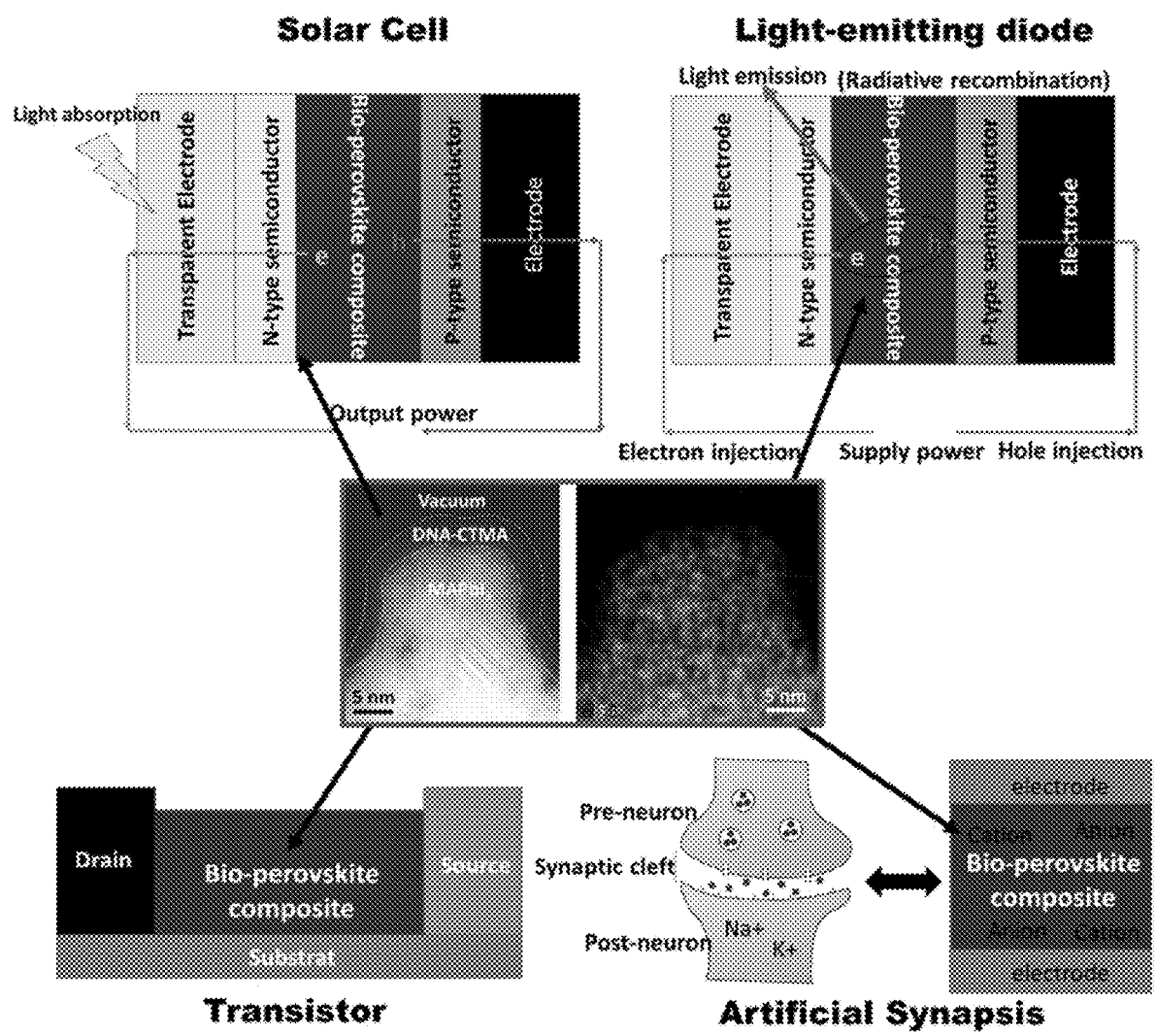
FIG. 20 shows the application of DNA-perovskite composite in optoelectronics beyond solar cell such as light-emitting diode, transistor, and artificial synapsis.

Versatility of multi-applications: In addition to above example, in a broader scope, this invention of the bio-perovskite composite film with core-shell nanostructure can be used in multiple optoelectronics. FIG. 20 shows the application of DNA-perovskite composite in optoelectronics beyond solar cell. For example, in light emitting diode (LEDs), DNA-perovskite composite works as a light-emission layer in the device. When external electron and hole are injected into the composite, radiative recombination occurs as the composite leads to the light emission. In the transistor device, the DNA-perovskite composite works as the semiconductor material allowing gate-controlled charge flow through this layer. In the artificial synapsis, which emulates important working principles of a biological synapse, including excitatory postsynaptic current, the composite provides the hysteretic current—voltage curve. These properties originate from possible ion migration in the ion-rich DNA-perovskite matrix. In general, the processing of the nanostructured DNA-perovskite composite is compatible with the device integration in above application platforms. Using above processing methods of preparing DNA-perovskite thin films on substrate of interest, followed by depositing functional buffer layers on top, one can achieve multiple optoelectronic devices with the DNA-perovskite being the core functional layer.

Versatility of the processing method: The previously described method to make DNA-perovskite composite can also be employed in synthesizing other biomaterial-perovskite material with novel properties. For instance, we have used the similar procedure to synthesize Artemisinin (a medical molecule extracted from natural herb)-perovskite composite and melanin (a biological pigments)-perovskite composite. These two materials are proven to be effective photovoltaic materials in perovskite solar cell and photothermal coating material to better harvest the thermal energy into electricity from sunlight. These results will be briefly described in below sections.

Figure 21:
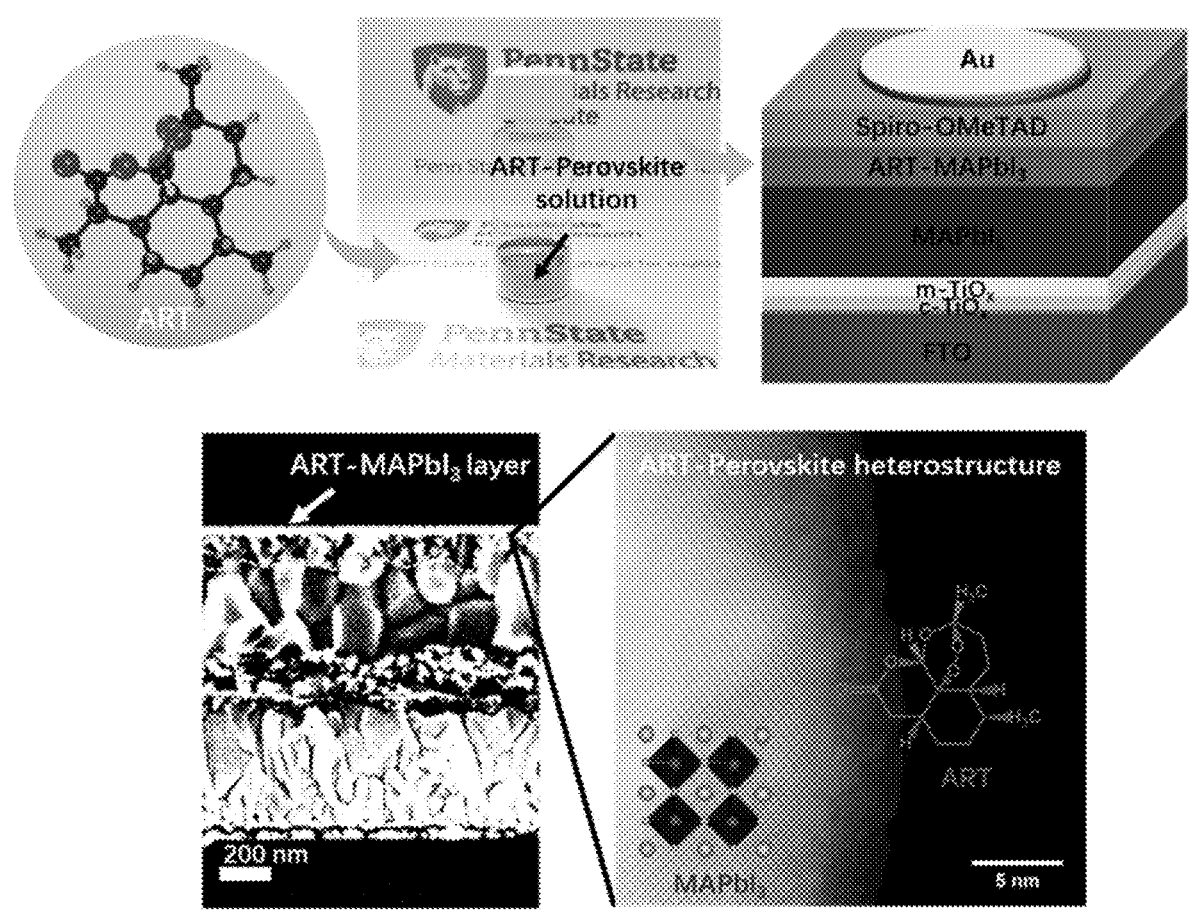
FIG. 21 shows schematic illustration of the synthesis of ART-perovskite composite (similar to DNA-perovskite) and its application in perovskite solar cell as well as the microstructure of ART-perovskite composite.

Referring to FIG. 21, likewise, nanocomposite consisting of perovskite and biomolecules beyond DNA can also prepared by the described method. Here another example of ART-perovskite composite is presented. The preparation method is similar to that for DNA-perovskite composite above. Briefly, biomolecules (can be any biomolecules, e.g., ART or artemisinin) are dissolved in acetonitrile containing amine molecules and other solvents such as ethanol, isopropanol, etc. This mixed solution can further dissolve perovskite crystals (e.g., $ABX_3$, A=FA, MA, Cs, etc., B=Pb, Sn, etc., X=Cl, Br, I, etc.). The film of bio-perovskite (e.g., ART-perovskite) nanocomposite is obtained by spin-casting/doctor-blading/slot-die coating/electro-spray-coating above solution (containing perovskite, biomolecules and amine in mixed solvents of acetonitrile, ethanol) on any substrates. FIG. 21 shows an overview figure for the application of the ART-perovskite ink in fabricating a layer in solar cell device. The ART-perovskite composite film in is made from the ART-perovskite solution (picture in FIG. 21).

Figure 22:
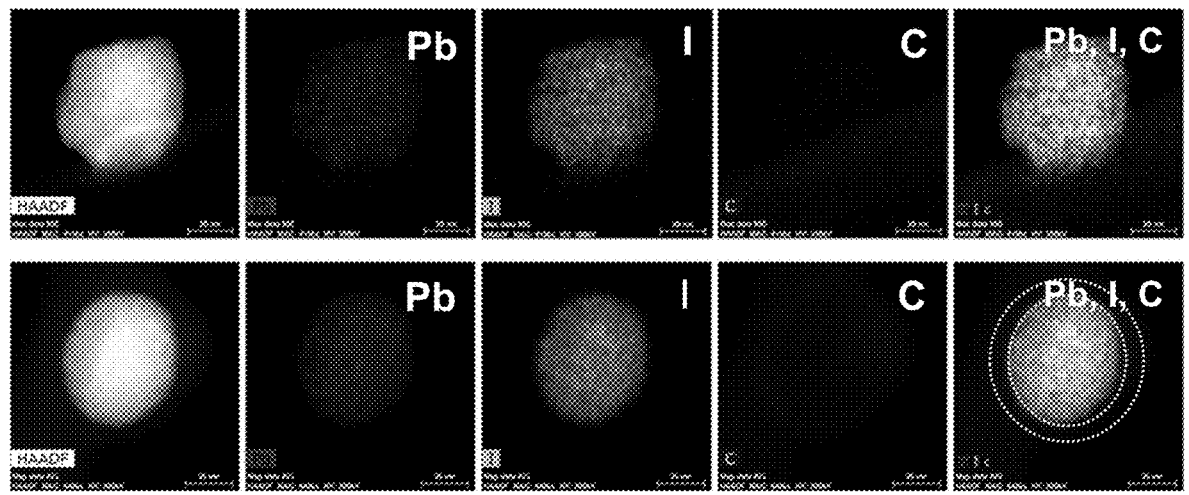
FIG. 22 shows the elemental mapping of pristine perovskite (upper panels) and ART-perovskite composites (lower panels), illustrating the core-shell configuration of the composite with ART layer covering the perovskite grain.

Referring to FIG. 22, microscopically, the ART-perovskite composite is in the form of a core-shell heterostructure, similar to the case of DNA-perovskite composite. FIG. 22 compares the high angle annular dark-field (HAADF) scanning transmission electron microscopy (STEM) image coupled with EDS mapping of individual Pb, I, C elements and complete mapping between pristine $MAPbI_3$ (from bottom layer) and ART-$MAPbI_3$ (from top layer), respectively. From the EDS mapping, the perovskite contains Pb, I, and C element in a single nanocrystal while the ART only contains the C element. It can be seen clearly, a carbon halo is surrounding the perovskite nanocrystal, indicating an ultrathin layer of ART (with a few nanometer scale) is wrapped outside the perovskite crystal.

Figure 23:
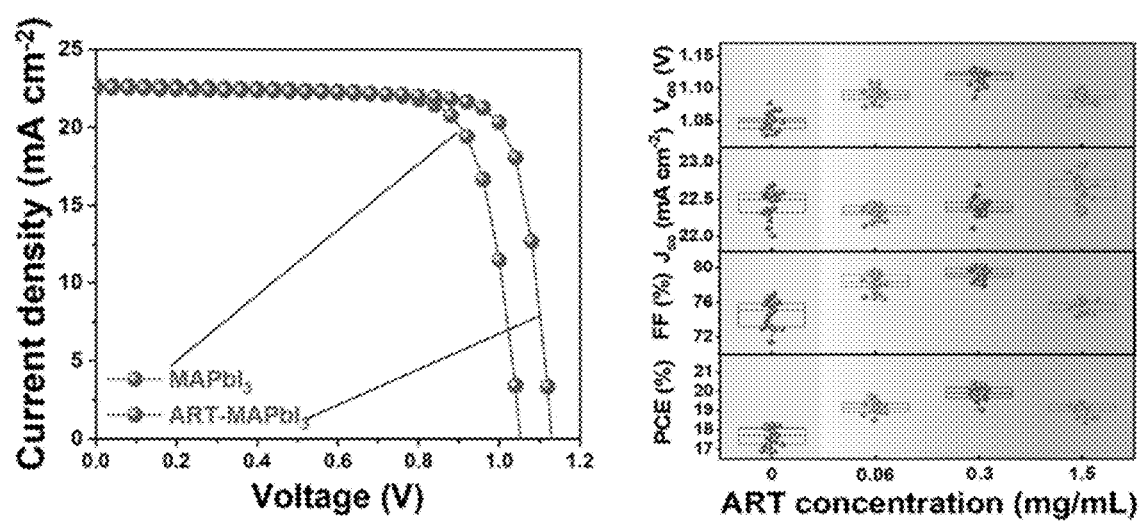
FIG. 23 shows the J-V characteristics of solar cell devices based on pristine perovskite and ART-perovskite composite materials and statistical analysis for the solar cell performance.

Referring to FIG. 23, this composite has superior optoelectronic properties including low trap density, high charge carrier mobility and low carrier recombination loss. As a result, the perovskite solar cell based on ART-perovskite shows improved performance than reference cell. FIG. 23 shows a comparison for the performance of solar cell device based on ART-perovskite and pristine perovskite. As seen in FIG. 23, ART-perovskite solution cell shows much improved performance as compared to the reference cell.

Figure 24:
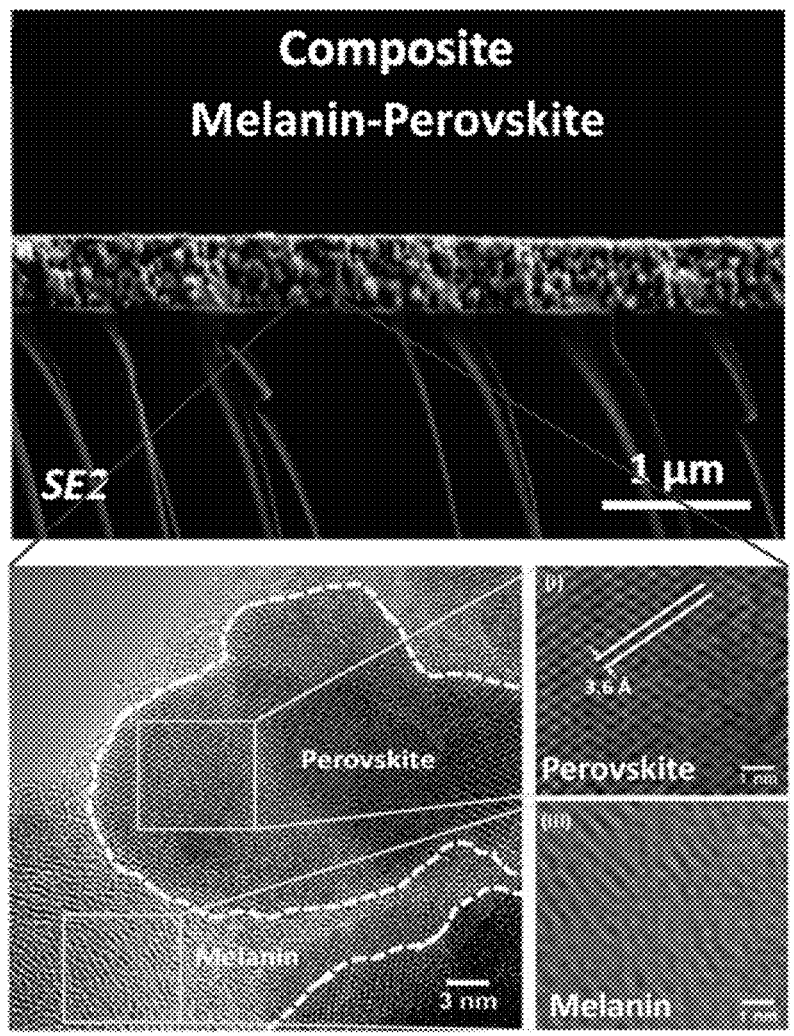
FIG. 24 shows the cross-sectional morphology of melanin-perovskite composite as well as the microscopic distribution of melanin and perovskite in the composite.

Referring to FIG. 24, another example of the bio-perovskite composite is the "melanin-perovskite" composite materials. This composite material is synthesized using the same method as the DNA-perovskite and ART-perovskite composite. Thin film of melanin can be directly printed from the solution, and the microstructural characteristics are similar between the DNA-perovskite and ART-perovskite, where the perovskite is coated by melanin layers. The image of backscattered electron (BSE, detected by the SE2-detector equipped in the SEM facility) in FIG. 24 shows the result. The brighter particles are corresponding to the perovskite crystallites that contain Pb element while the dark region is corresponding to the lighter weight melanin-rich phase. It can be seen that the brighter particles have identical size of ~60 nm. And these perovskite crystallites display a dimensional consistence from bottom to the top of the film. Typically, the larger grain size is beneficial for the charge transport as there is less grain boundary in the film. On contrary, in the film with smaller grain size, the higher grain boundary density induces more defects along the boundary, particularly when the amorphous melanin is located at the boundary between perovskite crystallites there will be more significant non radiant recombination loss of the excited charges (the role of melanin effect at grain boundary and trap in relation with the recombination loss). This will make the melanin-perovskite composite material useful for solar-thermal application.

Figure 25:
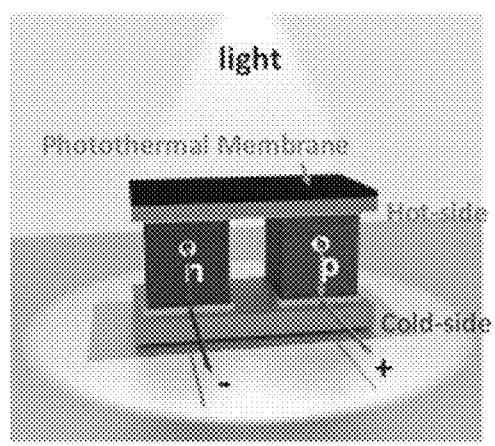
FIG. 25 shows a schematic illustration for the use of melanin-perovskite composite as coating membrane on the thermoelectric device for photothermal energy harvesting.

FIG. 25 shows the use of melanin-perovskite composite as coating materials on a commercial thermoelectric device and analysis of its photothermal conversion performance in comparison with multiple reference coatings. In the photothermal energy harvesting, heat of sunlight is absorbed on the hot side of thermoelectric device, and the temperature difference between hot side and cold side generates electrical output. FIG. 25 firstly shows the device structure of a thermoelectric module that consists of p-type and n-type legs. By coating different solar-thermal materials on the hot side, the solar radiation leads to the temperature increases on the hot side, causing a temperature gradient from the hot side to the cold side (room temperature). The temperature gradient drives both holes and electrons in the p-type and n-type materials to move from hot to the cold side, forming the current, according to the Seebeck effect.

Figure 26:
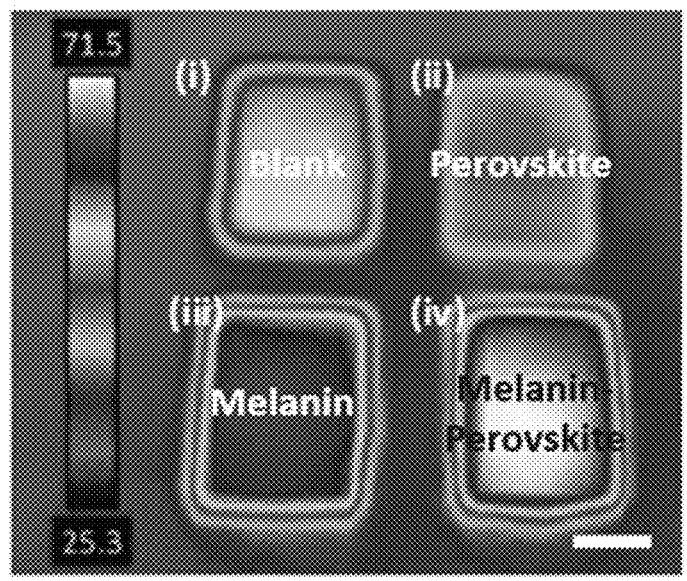
FIG. 26 shows the thermal images of (i) blank (no coating materials), (ii) perovskite, (iii) melanin and (iv) melanin-perovskite composite coated glass substrates.

FIG. 26 shows the thermal images of the glass substrates coated with different photothermal materials, after one-sun radiation for 1 h. Compared to pristine perovskite (~67° C.) and melanin ~51° C.), the melanin-perovskite composite displays the higher average temperature of ~71° C.

Figure 27:
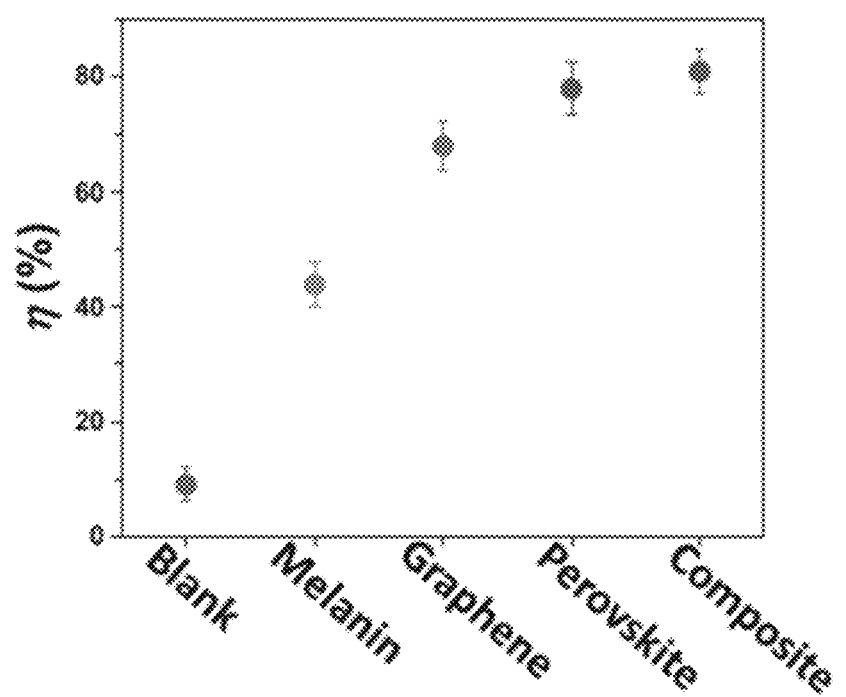
FIG. 27 shows calculated photothermal conversion efficiency ($\eta$) of different materials.

FIG. 27 compares the solar-thermal conversion efficiency of different materials. Notably, the pristine melanin displays an efficiency of 44.1±3.8%, comparable to prior results. The melanin-perovskite composite exhibits higher efficiency of 80.9±4.2%, higher than conventional inorganic solar-thermal materials such as plasmonic nanoparticles (~76-78%), and typical metal oxide nanoparticles such as $Al_2O_3$ (~58%), and even close to carbon nanotubes (CNT). This implies the high solar-thermal conversion efficiency for the melanin-perovskite composite.

Figure 28:
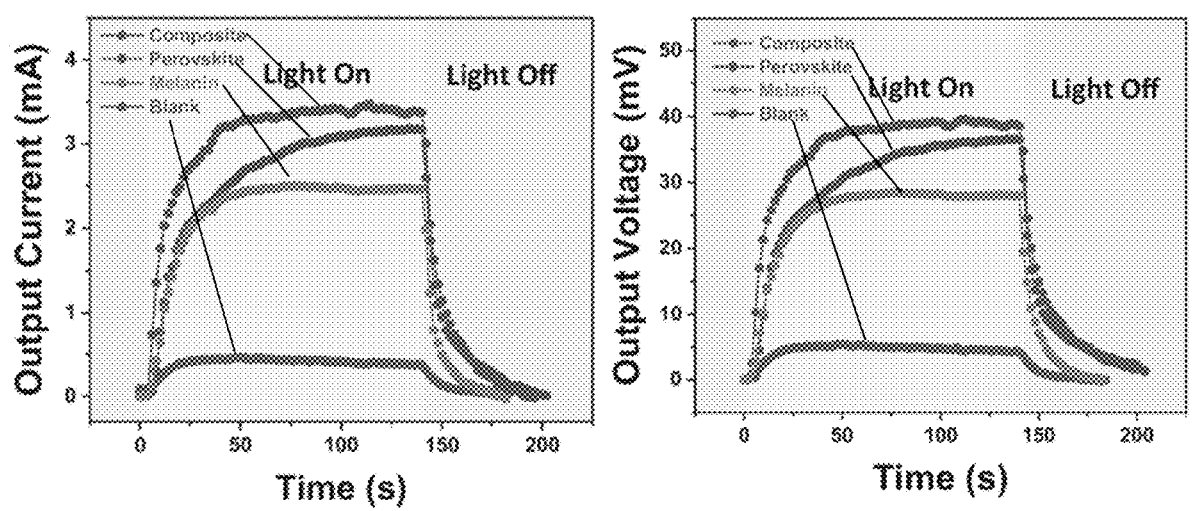
FIG. 28 shows output current and output voltage of thermoelectric devices coated with different materials and biomolecules, tested under one-sun radiation.

FIG. 28 compares the output current of thermoelectric devices coated with different materials. By switching on the light, the increased current was observed, owing to the increased temperature on the hot side. By switching off the light, the current decreases to zero. However, for different materials, the output current shows different values. Compared to the blank device (0.41 mA), melanin coating gives rise to an output current of 2.46 mA, pristine-perovskite coating renders 3.19 mA and the composite gives 3.44 mA. Same trends are found in the output voltage. Compared to the blank device, the composite-coated device shows a 7000% increased power output. Hence, the melanin-perovskite composite displays efficient solar-thermal conversion. Overall, these promising results demonstrating the versatility of the described method, which could be easily adopted to make other biomaterial-perovskite composite with novel properties for various applications.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

It should be understood that modifications to the embodiments disclosed herein can be made to meet a particular set of design criteria. Therefore, while certain exemplary embodiments of the system and methods of using and making the same disclosed herein have been discussed and illustrated, it is to be distinctly understood that the invention is not limited thereto but may be otherwise variously embodied and practiced within the scope of the following claims.

What is claimed is:

1. A photoactive material, comprising:
   a perovskite crystal structure having deoxyribonucleic acid-hexadecyl trimethyl ammonium chloride (DNA-CTMA);
   wherein the DNA-CTMA is coated around a grain boundary of the perovskite crystal structure.

2. The photoactive material recited in claim 1, wherein:
   the perovskite crystal structure comprises $MAPbI_3$ or other materials with general formula of $ABX_3$ with A being amine, B being Pb, Sn, or other bivalent metals, and X being halogen.

3. The photoactive material recited in claim 1, wherein:
   the DNA-CTMA is coated around more than one grain boundary of the perovskite crystal structure.

4. The photoactive material recited in claim 1, wherein:
   the DNA-CTMA is wrapped around the perovskite crystal structure at a grain boundary.

5. The photoactive material recited in claim 1, wherein:
   the DNA-CTMA is wrapped around the perovskite crystal structure at more than one grain boundary.

6. The photoactive material recited in claim 1, wherein:
   the DNA within DNA-CTMA facilitates hole transport by holes hopping among delocalized highest occupied molecular orbital (HOMO) orbits of DNA bases.

7. A perovskite solar cell, consisting essentially of:
   a substrate;
   an electron transport layer (ETL) disposed on at least a portion of a surface of the substrate and the ETL is an n-type semiconductor;
   a light-harvesting perovskite layer (PVK) disposed on at least a portion of a surface of the ETL, the PVK comprising a perovskite crystal structure having deoxyribonucleic acid-hexadecyl trimethyl ammonium chloride (DNA-CTMA); and
   an electrode disposed on at least a portion of the PVK.

8. The perovskite solar cell recited in claim 7, wherein:
   the DNA within DNA-CTMA facilitates hole transport by holes hopping among delocalized highest occupied molecular orbital (HOMO) orbits of DNA bases.

9. A perovskite solar cell, comprising:
   a substrate;
   an electron transport layer (ETL) disposed on at least a portion of a surface of the substrate;
   a light-harvesting perovskite layer (PVK) disposed on at least a portion of a surface of the ETL, the PVK comprising a perovskite crystal structure having deoxyribonucleic acid-hexadecyl trimethyl ammonium chloride (DNA-CTMA); and a hole transport layer (HTL) disposed on at least a portion of a surface of the PVK; and an electrode disposed on at least a portion of a surface of the HTL.

10. The perovskite solar cell recited in claim 9, further comprising:

an electrical circuit to facilitate capture of electric energy output generated by the perovskite solar cell.

11. The perovskite solar cell recited in claim 9, wherein:
the DNA within DNA-CTMA facilitates hole transport by holes hopping among delocalized highest occupied molecular orbital (HOMO) orbits of DNA bases.

12. The perovskite solar cell recited in claim 9, wherein:
the DNA is commercialized DNA or any lab-synthesized DNA using artificial sequencing with tunable length, twist, strand, and order of nucleotides to achieve band matching.

13. The perovskite solar cell recited in claim 9, wherein:
the perovskite crystal structure comprises $MAPbI_3$ or other materials with general formula of $ABX_3$ with A being amine, B being Pb, Sn, or other bivalent metals, and X being halogen.

14. The perovskite solar cell recited in claim 9, wherein:
the substrate comprises fluorine doped tin oxide (FTO), indium tin oxide (ITO), or other transparent conducting oxide (TCO).

15. The perovskite solar cell recited in claim 9, wherein:
the ETL comprises of an n-type semiconductor.

16. The perovskite solar cell recited in claim 9, wherein:
the HTL comprises of a p-type semiconductor.

17. The perovskite solar cell recited in claim 9, wherein:
the electrode comprises of gold, silver, or aluminum, conductive carbon materials, or conductive oxides.

18. A method of generating a hybrid perovskite crystal structure, the method comprising:

dissolving deoxyribonucleic acid (DNA) in distilled water;

dissolving hexadecyl trimethyl ammonium chloride (CTMA) in distilled water;

mixing the DNA water solution and the CTMA water solution to form a DNA-CTMA mixture;

allowing an ion exchange process to occur in the DNA-CTMA mixture to form a DNA-CTMA complex;

collection of DNA-CTMA precipitates from the DNA-CTMA complex;

forming a DNA-CTMA solution by dissolving the DNA-CTMA precipitates into a solvent;

forming a liquid perovskite intermedia;

adding acetonitrile to the perovskite intermedia to form a perovskite acetonitrile solution; and adding the DNA-CTMA solution into the perovskite acetonitrile solution.

19. The method of claim 18, further comprising:

forming a perovskite solar cell having a light-harvesting perovskite layer comprising the hybrid perovskite crystal structure;

modifying DNA length, twist, strand), or order of nucleotides to achieve band matching with a hole transport layer and a conductivity matching with the mixed perovskite; and/or using artemisinin molecules with or without DNA to improve charge transport.

20. A perovskite-based material, comprising:

biomolecules coated around grains of a perovskite crystal structure, wherein:

the biomolecules enhance light to thermal conversion by modifying thermal transport and/or, the biomolecules enhance charge and thermal transport by tailoring bandgaps and by imparting band matching.

21. A biomolecule-perovskite precursor solution, comprising:

a filler comprising deoxyribonucleic acid (DNA), artemisinin, or a biomolecule;

a matrix comprising perovskite with a general formula $ABX_3$ with A being amine, B being Pb, Sn, or other bivalent metals, and X being halogen;

a solvent comprising any one or combination of acetonitrile, ethanol, tetrahydrofuran.

22. A semiconducting smooth thin film, wherein:

the semiconducting thin film is formed from the biomolecule-perovskite precursor solution recited in claim 21; and wherein the semiconducting thin film is stable.

* * * * *